United States Patent [19]

Morton

[11] 4,306,113

[45] Dec. 15, 1981

[54] METHOD AND EQUALIZATION OF HOME AUDIO SYSTEMS

[76] Inventor: Roger R. A. Morton, 157 Sawmill Dr., Penfield, N.Y. 14526

[21] Appl. No.: 97,031

[22] Filed: Nov. 23, 1979

[51] Int. Cl.³ .................... H03J 5/24; H04B 17/00; H03H 5/00

[52] U.S. Cl. .................... 179/1 D; 179/1 MN; 179/1 P; 455/226; 333/28 T

[58] Field of Search ............ 179/1 MN, 1 P, 175.3 R, 179/1 D; 358/139, 167; 455/226, 72; 360/27, 65; 333/14, 18, 28 R, 28 T

[56] References Cited

U.S. PATENT DOCUMENTS 3,732,370 5/1973 Sacks .................... 333/28 T X

Primary Examiner—Aristotelis M. Psitos

[57] ABSTRACT

A method is provided for correcting errors in the overall reproduction characteristics of an audio system installed in a residence. The method may include the steps of generating a test signal as an input to the audio system and converting the resulting sound generated by the system and its room environment into stored data whose values are a function of the sound. This data is then transported from the residence of a processing center. At the processing center, the stored data is read and utilized to fix the characteristics of an equalizer such that when it is installed in an audio system, it will give the desired correction to the output thereof. Thereafter, the resulting equalizer is transported to the residence and installed in the audio system.

4 Claims, 39 Drawing Figures

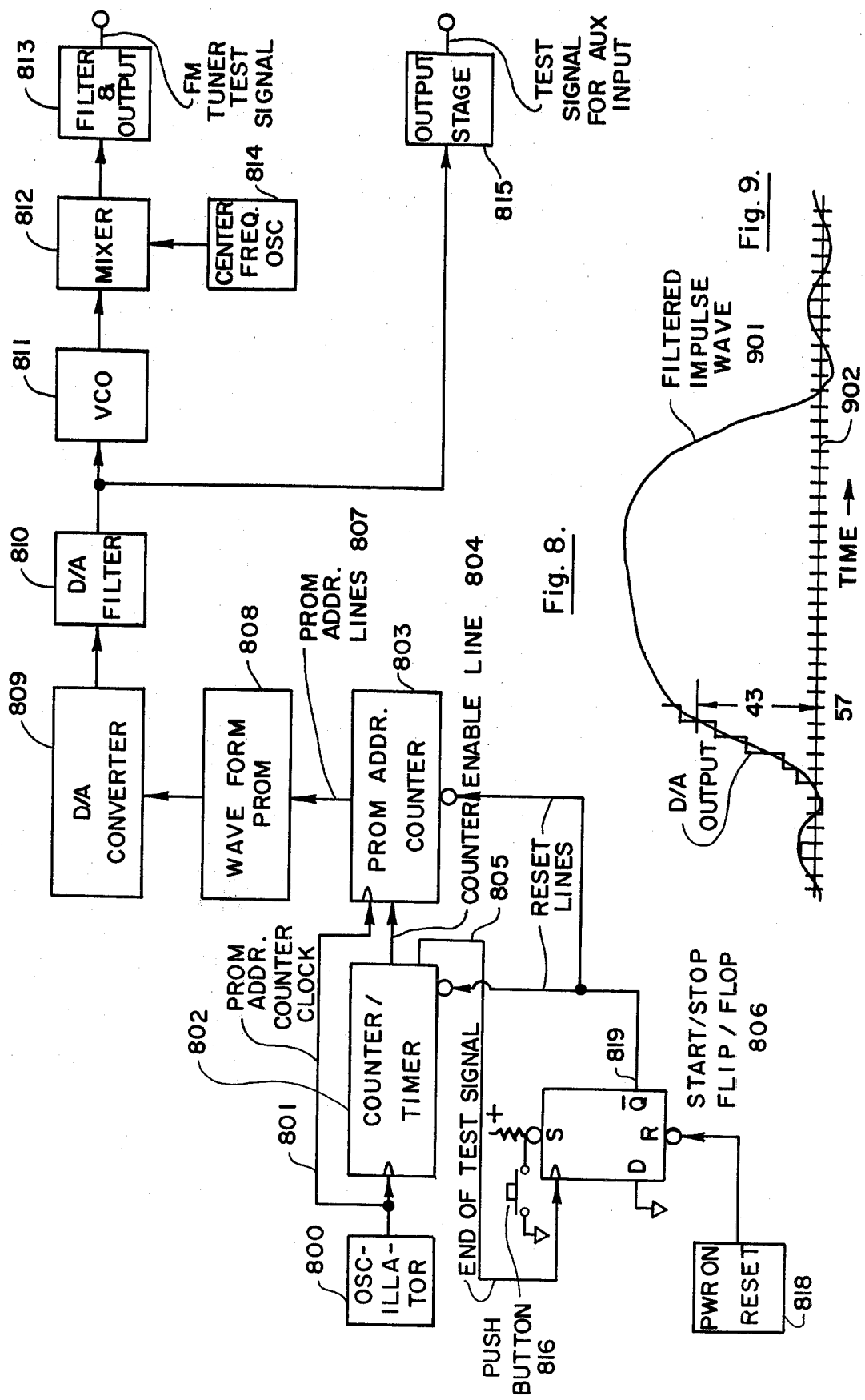

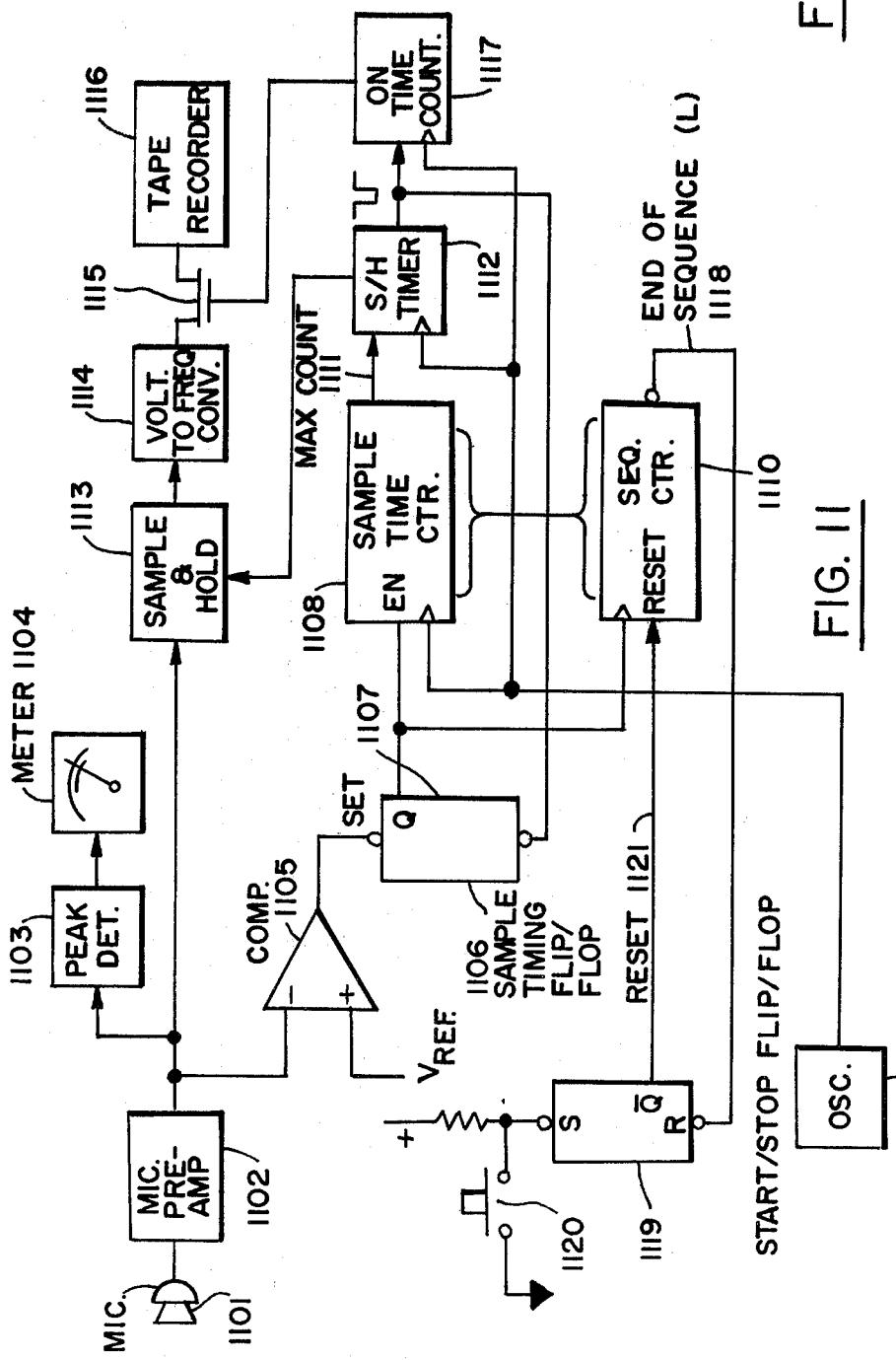

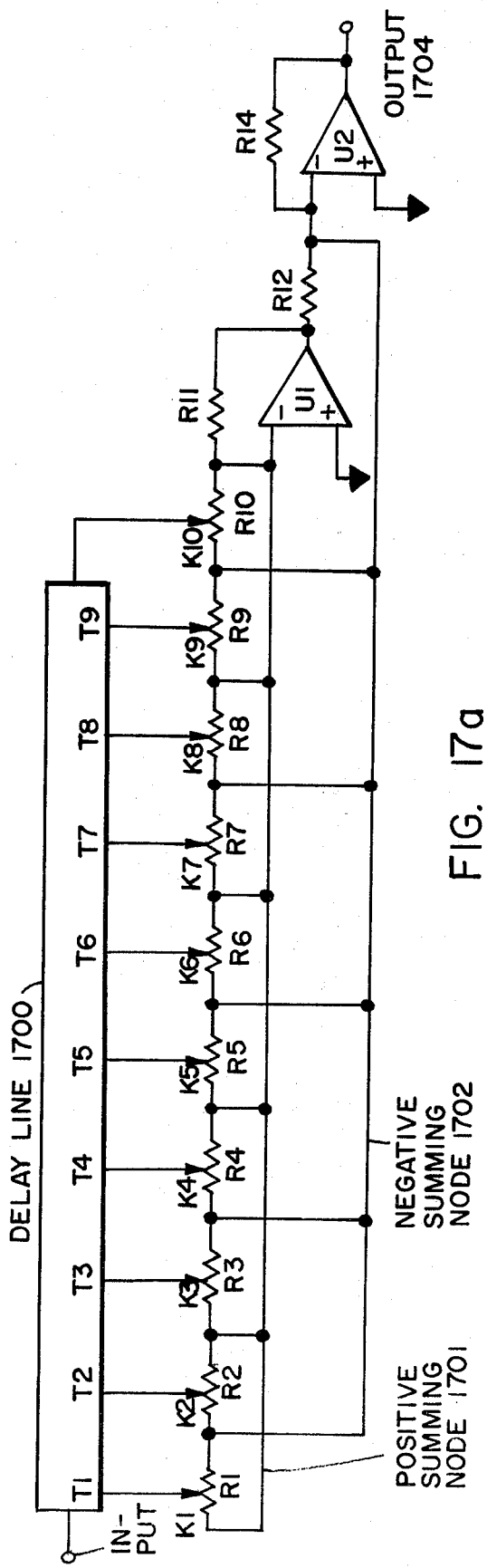
FIG. 17a
FIG. 17b
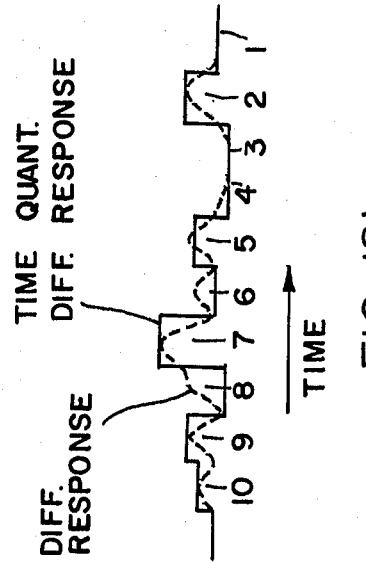
FIG. 18a
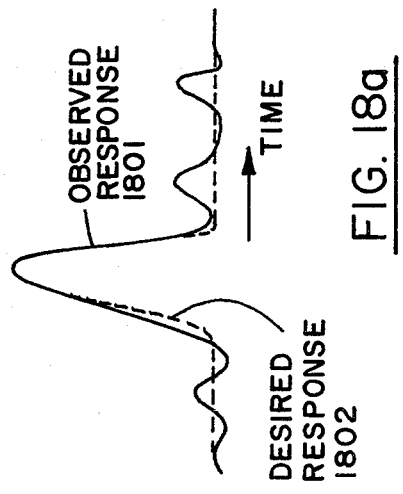
FIG. 18b

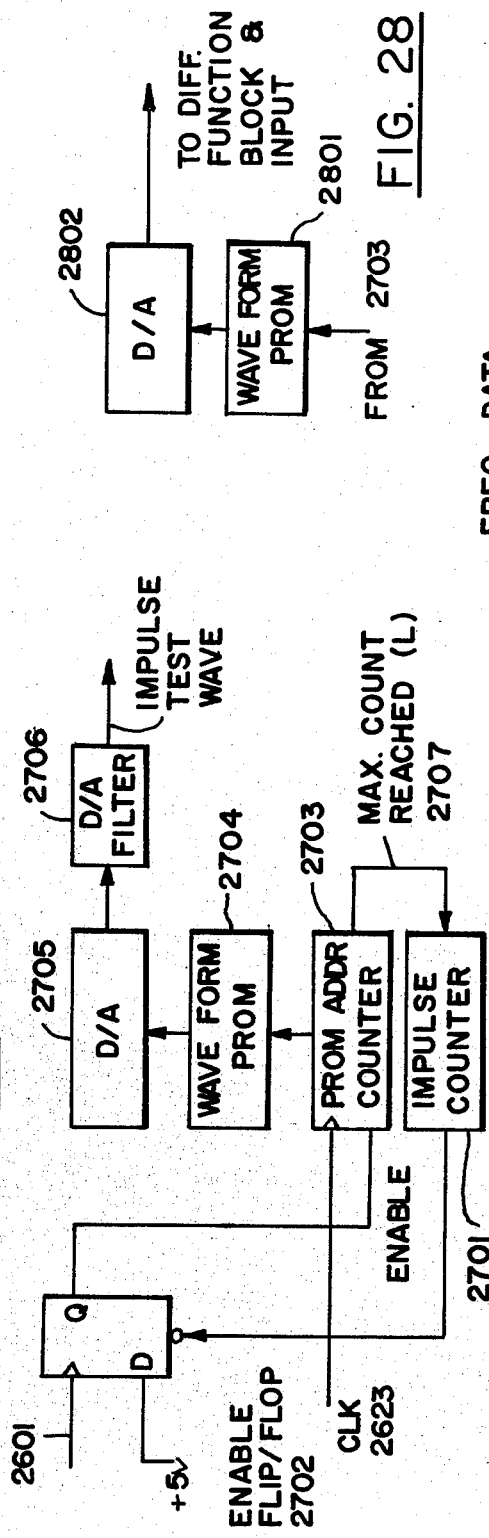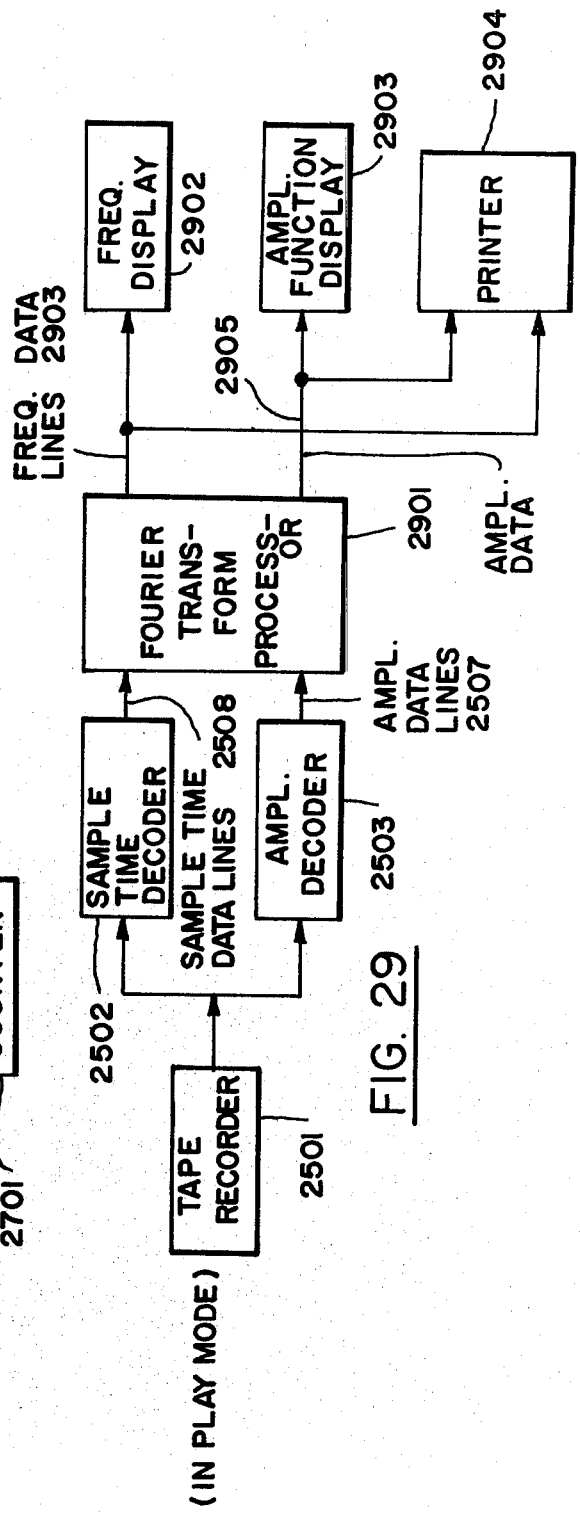
FIG. 27
FIG. 28
FIG. 29

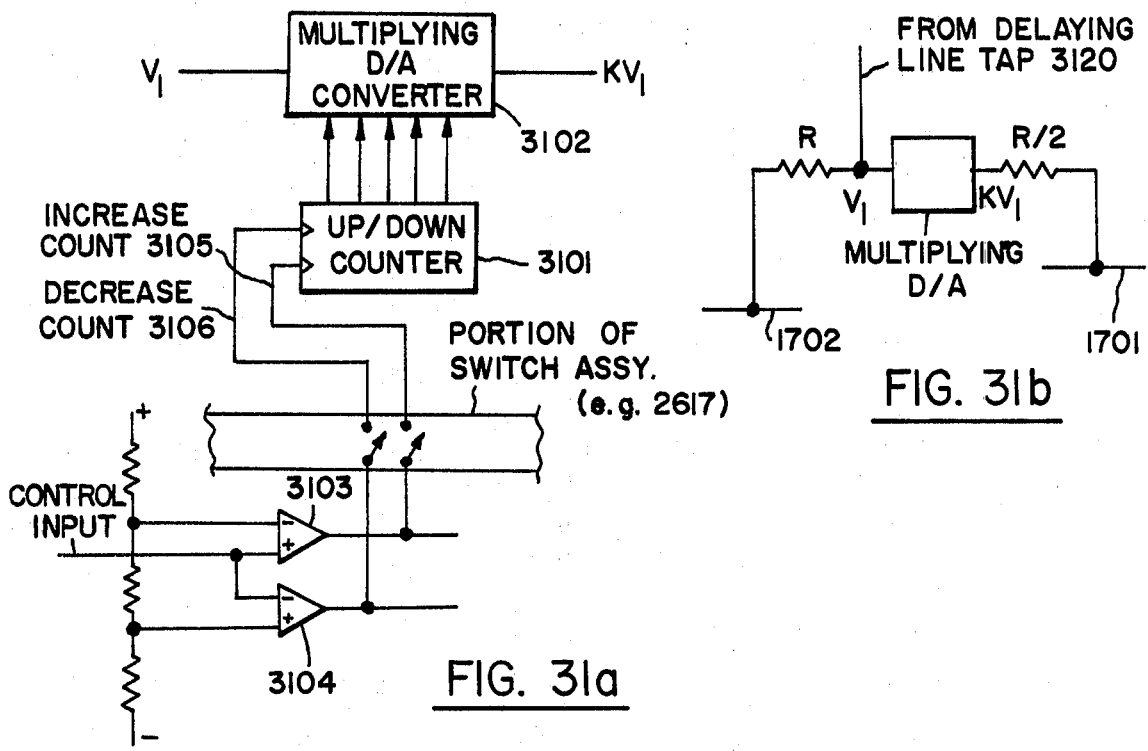
FIG. 31a
FIG. 31b
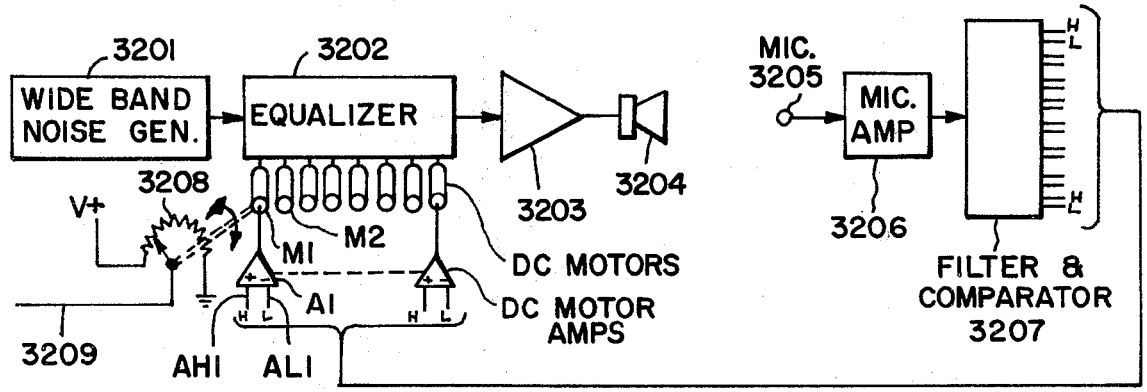
FIG. 32
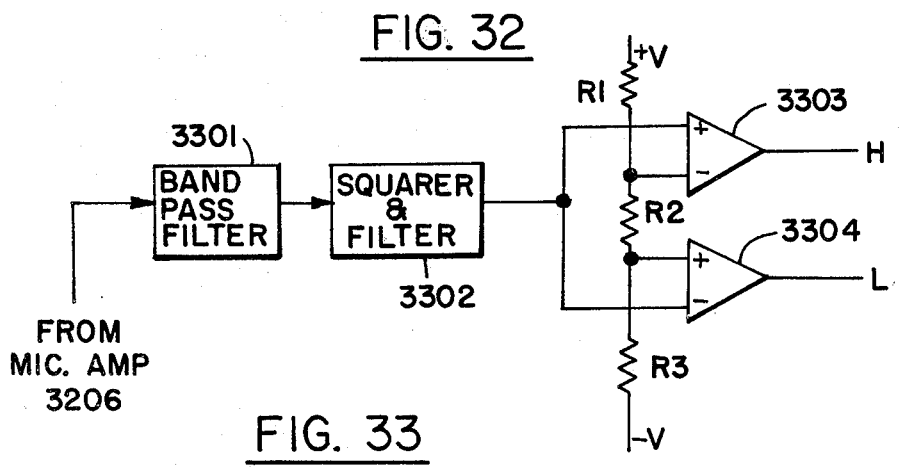
FIG. 33

METHOD AND EQUALIZATION OF HOME AUDIO SYSTEMS

INTRODUCTION

In a typical audio system the sound heard by the listener is influenced by a large number of factors. For example when listening to a phonograph recording, the frequency response of the cartridge, resonant properties of the pick up arm, the accuracy of the RIAA response of the preamplifier, the characteristics of the power amplifier, the characteristics of the loudspeaker and the audio characteristics of the room can all contribute to a degradation of the quality of sound which the listener hears. As a result, although for example, considerable attention may be paid to the frequency response of the individual components, the overall frequency response of the components connected together can result in perceptual degradation of the quality of the sound heard. This effect (sometimes termed coloration) occurs regardless of whether the sound is derived from a phonograph record, a transmitted radio signal, a recorded tape or a live performance.

Most if not all of the prior techniques for correcting the effects of coloration in audio systems through equalization have been limited to manual equalizers. These equalizers enable the listener to adjust the intensity of sound over specific bands of the audio frequency spectrum, and enable him to select the tonal balance which he finds most pleasing. The difficulty of this technique lies in the fact that the average listener is frequently unaware of the exact sound intended to be reproduced by the program source. Consequently the sound heard by the listener may differ considerably from the sound which the musicians and the recording engineer strived to produce.

Thus the insertion of an equalizer in the audio system has the potential of reducing the coloration by modifying the frequency response of the audio system. However, the user of the audio system rarely has any way of determining the frequency characteristics of the equalizer which yields the most faithful audible reproduction.

In an attempt to overcome this problem, spectrum analyzers have come onto the market to enable a serious listener to determine, with the aid of a test frequency source, the actual response characteristic of this audio system. Having gone through this procedure, it is at least theoretically possible for a listener, with an analyzer, to adjust his equalizer to correct for the frequency characteristics measured using the spectrum analyzer. This process is both difficult and time consuming and requires the user have the necessary equipment, including microphone, spectrum analyzer, test source and manually adjustable equalizer at his disposal.

As indicated above, one of the factors which affects the degree of coloration is the audio characteristics of the particular room in which the speakers are situated. The room audio characteristics will vary from room to room depending on the configuration of the room, the materials forming the walls, floor and ceiling of the room and even the particular arrangement of furniture in the room. It is not feasible to adjust an equalizer at the factory to accommodate individual room audio characteristics because the latter are an unknown quantity until an actual audio system is installed in a specific room. Also as indicated above, it is theoretically possible for the individual audiophile to purchase spectrum analyzers and other "laboratory-type" equipment so as to be able to make equalization adjustments in his own home for a specific room but this is expensive and cumbersome as aforesaid. Therefore, the user of audio systems who does not have virtually unlimited funds is relegated to an equalization which may not and probably will not conform to a true equalization taking into account all sources of coloration.

A REVIEW OF EQUALIZATION AND INDENTIFICATION

In general equalization involves the insertion of a linear or non-linear circuit to correct for errors arising from other functional elements which will be, or have been encountered by the signal. Many different types of equalization can be performed. These include frequency equalization (probably the most common), time domain equalization and phase equalization. Determining the desired characteristics of the equalizing device involves choosing the type of equalization to be employed and then identifying characteristics of the signal path to be equalized. Identification can be performed by applying a known test signal to the signal path and observing the output response of the signal path. Various types of test signals can be used including sine waves of various frequencies, narrow-band noise, or noise subtending a known frequency range, wide-band noise covering a large part of the frequency range at which the signal path will operate, square waves or impulse functions.

The types of measurements or observations to be carried out at the output of the system depend on the type of known input test signals being used. These measurements may include determination of signal amplitude, analysis of the auto-correlation function of the output signal and, possibly storage of the entire profile of the output signal. In addition the desired characteristics of the equalizer may be determined by cross-correlating an arbitrary input signal with the resulting output signal. Determination of the desired equalizer characteristics is based on such measurements.

SUMMARY OF INVENTION

In accordance with this invention, an equalization method is provided for correcting errors in the overall reproduction characteristics of an audio system installed in a residence in such a manner that all sources of coloration, including especially those contributed by the room, can be accommodated and corrected without the use of expensive and time consuming techniques in the residence. The audio system may include the usual means for reproducing an audio signal from a record, a tape, a radio transmission receiver or the like, and also includes an amplifier and a speaker located in a room in the residence. The method of equalization of such a system includes generating a test signal as an input to the audio system and converting the resulting sound generated by the speaker and its room environment into stored data whose values are a function of the sound. The stored data is then transported from the residence to a processing center which is designed to process the incoming stored data from a large number of residences so that the expense for servicing each residence can be a relatively nominal figure, even though the equipment at the processing center may be rather sophisticated and expensive. At the processing center, the stored data is read and the read out data is utilized to fix the characteristics of an equalizer such that the resulting equalizer, when installed at the residence in the audio system, will give the desired correction to the output thereof. The resulting equalizer is then transported to the residence and installed in the audio system.

BRIEF DESCRIPTION OF DRAWINGS

FIG. 8 is a test signal generation block diagram for generating an impulse test signal;

FIG. 9 is an example of the generation of an impulse test signal;

FIG. 11 is a block diagram of a data collection circuit for collecting data from an impulse response signal;

FIG. 12 is a block diagram of a data collection circuit for collecting data from a test using noise signals;

FIG. 15b shows the shape of the frequency response of the equalizer section shown in 15a;

FIG. 16b shows the possible range of frequency response of the equalizer section shown in 16a;

FIG. 17a shows a circuit configuration of an adjustable time domain equalizer filter;

FIG. 17b shows an alternative configuration using selected fixed resistors for the circuit shown in 17a;

FIG. 18a shows the observed audio system response to an impulse test signal and the desired response to an impulse test signal;

FIG. 18b shows the difference in response between observed response and desired response, and the time quantized version of the difference response;

FIG. 27 is a diagram of a test signal generation block for use in conjunction with FIG. 25;

FIG. 28 shows a method of generating a reference impulse response;

FIG. 29 is a block diagram of a processing unit based on FIG. 3 for frequency compensation from impulse response data;

FIG. 31a shows a method of replacing potentiometers with digital counters and digital to analog converter units;

FIG. 31b shows a method for introducing a multiplying digital to analog converter into the time domain filter of FIG. 17a to replace the adjustable resistors;

FIG. 32 shows a method for using wide band noise to simultaneously test and adjust an equalizer; and FIG. 33 shows one section of a filter and comparator block used in FIG. 32.

DESCRIPTION OF THE PREFERRED EMBODIMENTS

A. General Description of Invention

Figure 1:
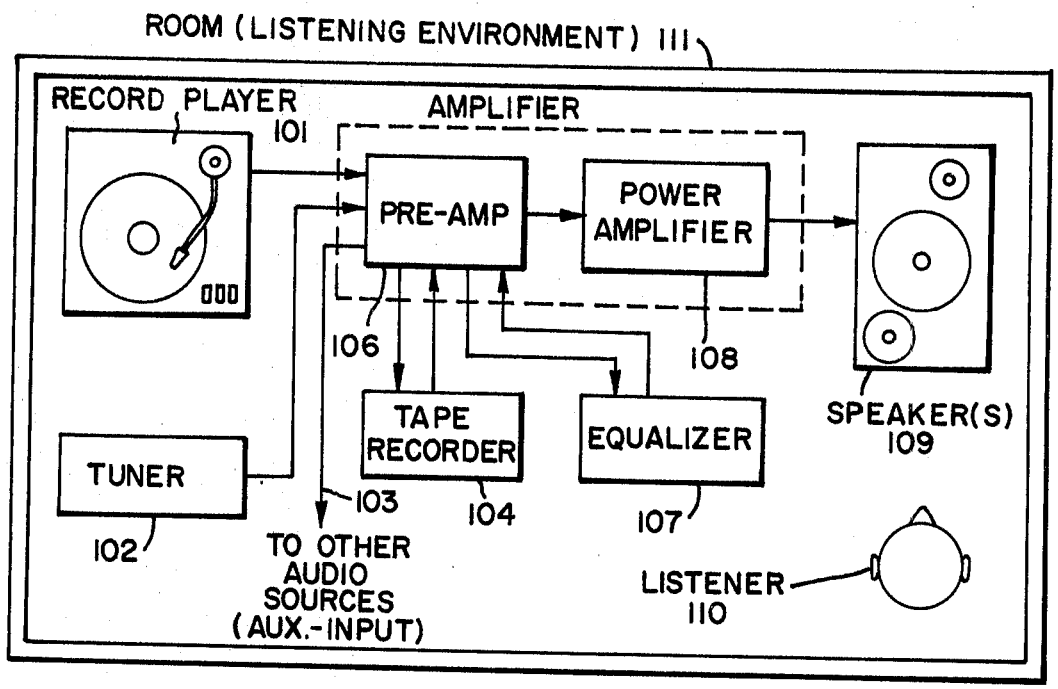
FIG. 1 shows a typical home audio system.

As shown in FIG. 1, a home audio system may comprise a variety of components. One group of such components provides program material. This group includes, for example, a record player 101 comprising a turntable and pick-up arm, an AM or FM tuner 102, as well as other audio sources entering through an auxilliary input line 103. A tape recorder 104 may be used to record material from a program source or play prerecorded tapes. These components are connected into a preamplifier 106 which is used to select the desired program source. Such components may employ either conventional analog techniques, or one or more of the various recently emerging digital recording and audio processing techniques. Frequently the preamplifier 106 may also be connected to an external equalizer 107 or may include an internal equalizer. These equalizers are used to adjust the tonal quality of the material to suit the individual preferences of the listener. However the listener is rarely able to adjust such an equalizer for the most accurate reproduction, due to an inability to objectively discern which settings provide the greatest accuracy. One of the objectives of this invention is to provide a means for solving this problem.

The output of the preamplifier passes 106 to a power amplifier 108 which amplifies the audio signal and this signal passes to one or more loudspeakers 109 which reproduces the audio sound in the room or listening environment 111 of the listener 110. Each of the components in the audio system may contribute to the overall coloration of the source material. However the most significant contributors to such coloration are usually the loudspeaker 109 and the acoustic properties of the listening environment or room 111.

Loudspeakers produce significant coloration due to the inherent limitation of their mechanical structure. These limitations arise from diffraction effects, resonances, and harmonic and intermodulation distortions, which although considerably improved in recent times, are still easily detected by a careful listener.

The room environment also introduces coloration. A listener in a room will hear two types of sound fields. One termed the "direct field" corresponds to sound directly emanating from the loudspeaker. The other called the "reverbration field" corresponds to sound which has been reflected or diffracted by walls or furniture prior to reaching the listener's ears. If the sound is reflected a number of times, standing waves form within the room and these also add to the coloration of the sound perceived by the listener.

Manual equalizers which are currently available on the market are intended to provide the listener with a means for correcting for these affects. However, the lack of any objective measure as to what is the best correction, as well as the limited correction capabilities of such equalizers, even when objectively adjusted, severely limits the usefulness of these devices.

The purpose of the equalization technique disclosed herein is to enable the design and manufacture of equalizers optimized for specific audio systems installed in a home or other residence, and employs the following steps. The first step (FIG. 2) involves generating a test signal as an input to the audio system comprising at least an amplifier 201 and loudspeaker 202. The test unit 204 may generate the input test signal to be fed into the audio system, or a recorded input test signal may be used if the path to be equalized includes a phonograph or tape player. The microphone 203 detects the resulting sound output of the audio system in response to the test signal, and the test unit 204 provides a means for converting the resulting sound generated by the speaker and its room environment into stored data whose values are a function of the resulting sound. The stored data may for example be stored on a storage medium such as magnetic tape.

The second step is to transport the stored data from the residence to a processing center.

The third step (FIG. 3) employs the use of a processing unit 301 to read and process the stored data and to use this data to automatically adjust the specially designed equalizer 302 so that its characteristics will equalize the tested audio system.

Figure 4:
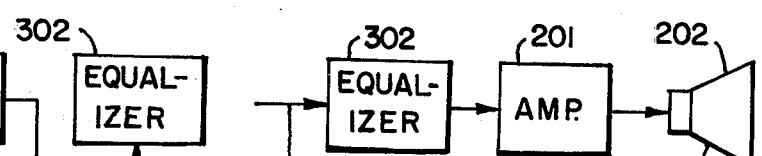
FIG. 4 is the third step of implementing the present invention.

The fourth step (FIG. 4) involves transporting the resulting adjusted equalizer 302 to the residence and installing it in the audio system so that the overall performance of the audio comprising at least amplifier 201 and loudspeaker 202 system is improved by correcting for errors inherent in the audio system.

Figure 3:
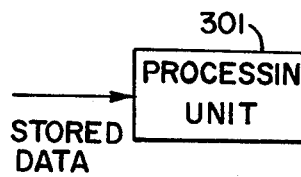
FIG. 3 is the second step of implementing the present invention.
Figure 5:
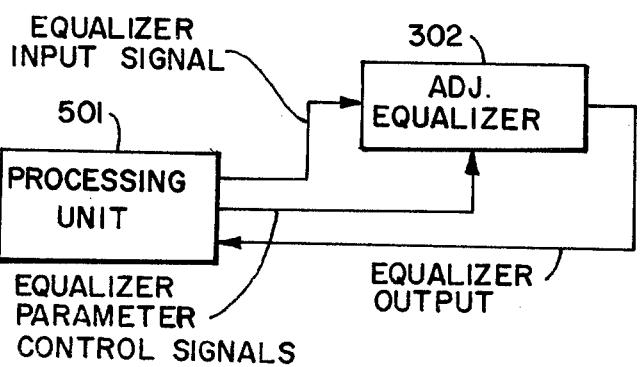
FIG. 5 is an alternative method for implementing the second step of the present invention.
Figure 26:
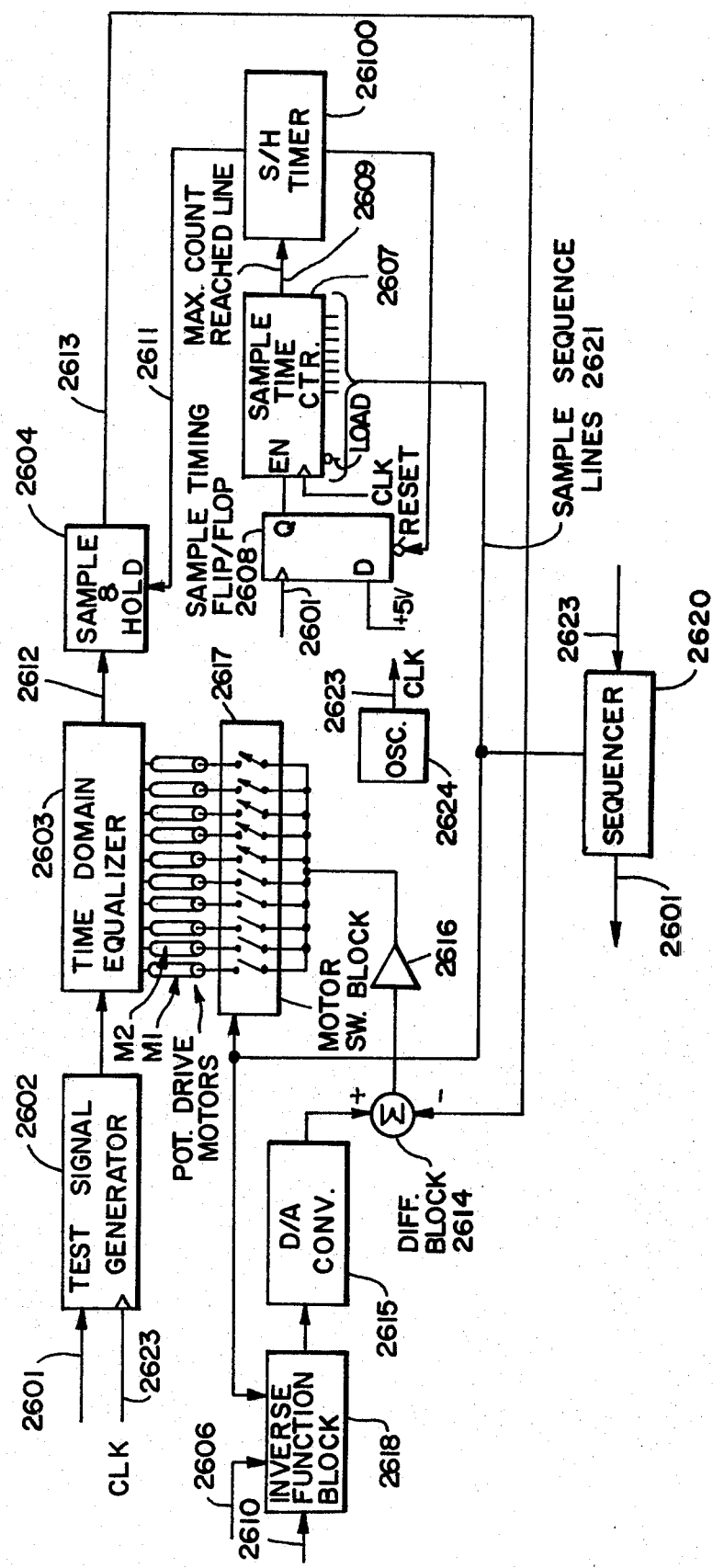
FIG. 26 is a diagram of additional circuitry for automatically adjusting the value of time domain equalizer components to achieve the desired equalizer characteristics.

An alternative, to step 2 depicted in FIG. 3, is shown in FIG. 5 and is described in more detail in conjunction with with FIG. 26. This alternative enables a processing unit 501 to adjust the equalizer 302 and to monitor the effect of the adjustments on the characteristics of the equalizer 302. This ensures that the desired characteristics of equalizer 302, dictated by the accumulated test data derived from the test unit 204, are in fact implemented in the equalizer 302.

Thus in accordance with this invention the customer desiring to have his home audio system equalized would, on payment of a deposit, receive from a processing center or retailer a test unit and associated microphone plus appropriate reference signal source material such as test phonograph records, or magnetic tapes.

He would then take this test unit and associated equipment home and connect them into his audio system. The test unit would be used to accumulate and store data corresponding to the overall transfer characteristics of his audio system and its room environment, and the stored data would be sent to a central processing location.

The equalizer would be implemented at the central processing location. When stored data from the test unit are received, the data are passed to a processing unit, which can set the parameters of an adjustable or specifically tailored equalizer so that when installed in the user's audio system, the audio system exhibits an optimum response.

Then the resulting audio equalizer is sent to the user for installation into his system to provide an optimized system response.

B. Selection of Test Signals

The design of the three major modules, the test unit, the processing unit and the equalizer depend on the type of signal used to test the audio system and its room environment. Possible test signals include:

1. Sine waves of various frequencies. The use of sine waves of various frequencies enables frequency response characteristics, and with special provision, phase compensation characteristics to be determined.

2. Band-Limited Noise of Various Frequencies. The use of band-limited noise at various center frequencies provides for the correction of frequency errors in the overall audio system, and has the advantage that it is not as affected by standing waves in the room in which the audio system is installed.

3. Wide-Band Noise. Wide-band noise also provides for the correction of frequency characteristics, again without serious interference by standing waves in the listening room. The noise response waveform can be analyzed using spectral, auto-correlation or cross-correlation techniques.

4. Band-Limited Impulse Function. A variety of impulse functions with various weightings and limited to various frequencies bands (e.g. hamming weighted of frequency limited impulse functions) can be used to identify the characteristics of the audio system. These signals provide for time domain equalization and can be used to separate room affects from overall audio system affects.

Alternatively using Fourier transform techniques an equalizer designed for frequency correction can be adjusted based on data derived from impulse testing.

5. A known passage of music or other test signal may be played and the resulting power spectrum of the sound generated in the room, measured and compared to the actual power spectrum of the piece. From this, the frequency equalization settings may be obtained. Alternatively, input and output signals may be cross-correlated to characteristics identifying the desired equalizer.

C. The Test Unit

Figure 2:
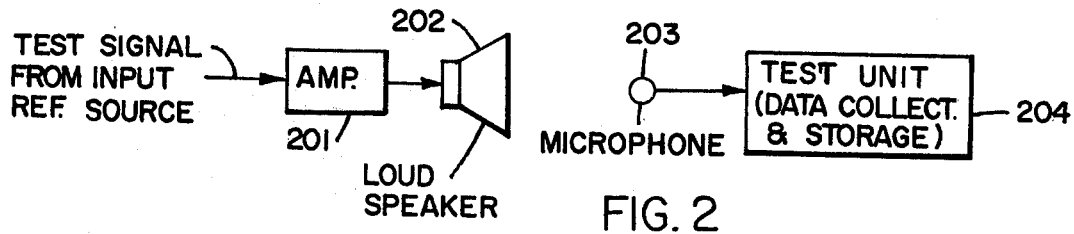
FIG. 2 is the first step of implementing the present invention.

As already has been described, the test unit shown in FIG. 2 can be implemented in different ways, depending on the type of input reference signal used to identify the characteristics of the audio system.

The test unit to be described comprises two major sections. The first is the test signal generation circuit which generates the input test signal for testing an audio system in which the path to be equalized may be either a tuner, or auxillary input. The second section of the test unit, termed the data collecting circuit is used to store the response signal generated by the audio system (or data derived therefrom) using techniques which ensure that characteristics of the response signal, used to generate the equalizer characteristics, are accurately preserved.

D. Generating Sine Waves and Band Limited Noise Test Signals

Figure 7:
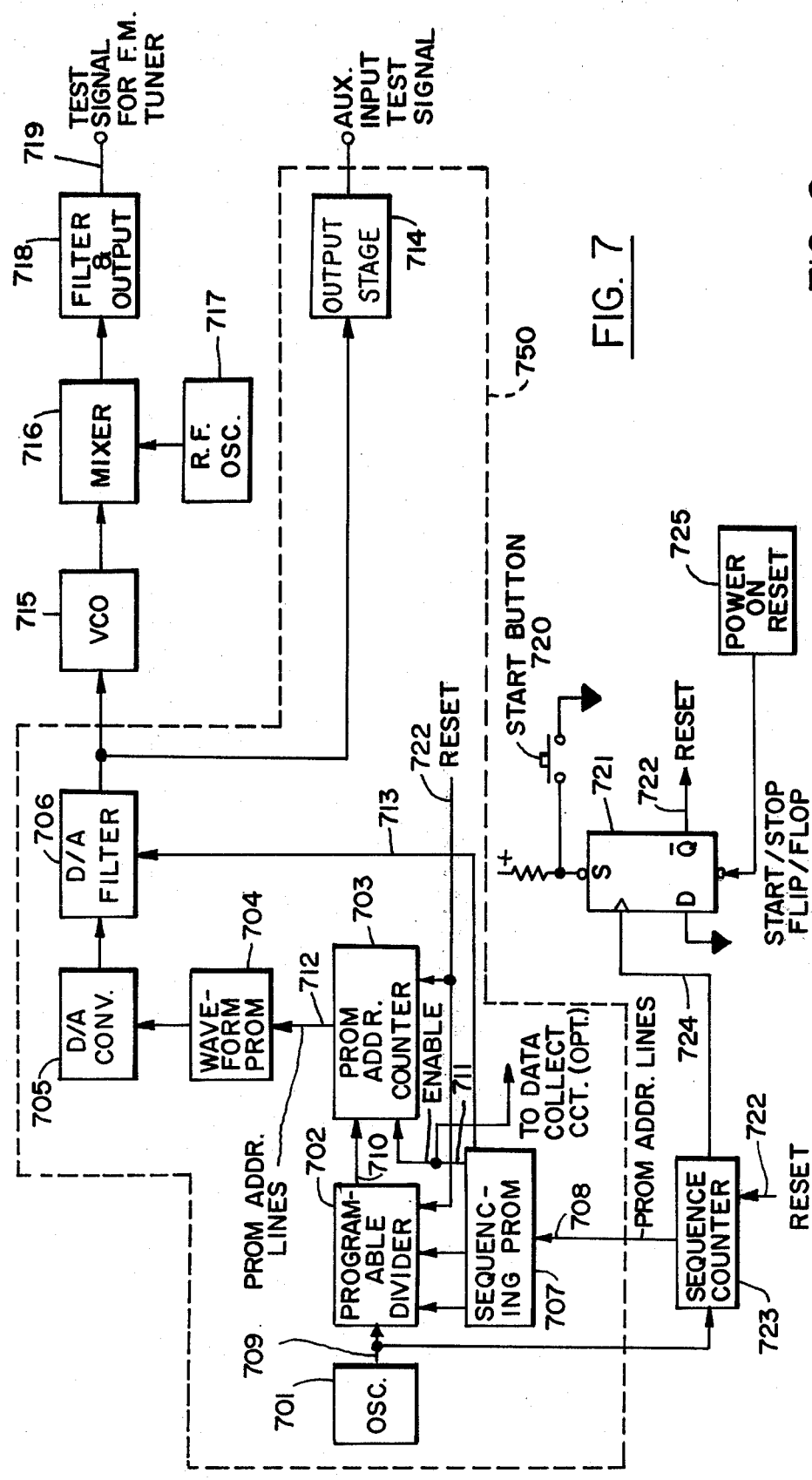
FIG. 7 is a test signal generation circuit block diagram for sine waves or narrow band noise.
Figure 6:
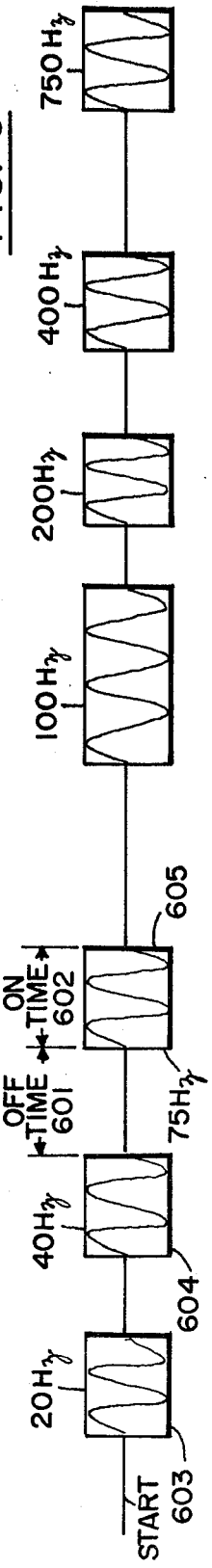
FIG. 6 is an example of portion of an output test signal showing the "on time" and "off time" of signal bursts.

The test signal generation circuit section for generating sine waves or narrow band noise is shown in block diagram form in FIG. 7. The operation of the circuit is as follows. The oscillator 701 (using for example Texas Instruments 74LS124 integrated circuits) generates a clock signal on line 709 which passes through a Programmable Divider 702 (employing for example Texas Instruments 74LS163 integrated circuits) whose output 710 corresponds to, for example, a 128 kilohertz clock signal. The oscillator output signal 709 also passes to the sequencing counter 723 comprising, for example, Texas Instrument SN74LS163 integrated circuits. The sequencing counter 723 is used to step through the frequency values at which the test will be performed and to provide appropriate space between each burst of test signal as shown in FIG. 6. The spacing between each frequency burst ("off time" 601) and the duration ("on time" 602) of each frequency burst (e.g. 603, 604, 605) can be selected so that the "off time" 601 between each frequency burst in conjunction with the "on time" 602 of each frequency burst can be used, when processing the test data, to uniquely identify each burst. FIG. 6 shows a portion of a possible output test signal. The sequencing programmable read only memory 707 (PROM) (e.g. Texas Instruments SN74S287) (or Read Only Memory ROM) in FIG. 7 stores data corresponding to the frequency, "on time" and "off time" of the sequence of test signals generated by the signal generator. The address lines 708 of the sequencing PROM 707 are controlled by the outputs of sequencing counter 723. Data from the sequencing PROM 707 is used to load the programmable divider 702 which divides the oscillator 701 frequency signal on line 709 to generate a pulse train whose rate controls the frequency of the test signal to be generated. Consequently the data from the sequencing PROM 707 determines the frequency of the output signal. The programmable divider 702 can be implemented using for example Texas Instrument SN74163 counters together with SN7400 control logic which count from preset values determined by the data from the sequencing PROM 707. The pulse train from the programmable divider on line 710 is fed to the PROM address counter 703 (using, for example T.I. SN74163) which counts pulses from the programmable divider 702. The PROM address counter 703 may have a total count range of, for example, 128 counts and each of these counts will be used to determine the specific amplitude of a point on the final output wave-form. During "off time" or space between each sine wave burst generated by the signal generation circuit, no output is required. To achieve zero output during the "off time" the PROM address counter 703 is disabled by an enable line 711 from the sequencing PROM 707 going low. This line is asserted by the data pattern in the sequencing PROM 707 to establish the periods of zero output in the test sequence. The PROM address counter 703 controls the address lines 712 of the waveform PROM 74 (Programmable Read Only Memory e.g. T.I. SN74S287, or optionally ROM). The waveform PROM 704 contains data corresponding to the amplitude at each instant of time defined by the data on the incoming PROM address lines 712. This digital data is outputed to a digital to analog converter (D/A) 705 (for example DATEL DAC-6912B) which produces the analog voltage corresponding to the desired audio test waveform. Thus for example if the PROM address counter 703 has a count range of 0 to 127, and it is desired to generate a sine wave, the data in the waveform PROM 704 will correspond to 128 points along one full cycle of the sine wave. In order to remove any higher harmonics which may be generated by the D/A converter 705, a D/A filter 706 receives the output of the D/A converter to attenuate the higher frequencies. It may be necessary to control the bandwidth of this D/A filter through an additional line 713 from the sequencing PROM 707 to ensure that the bandwidth is consistent with the frequency of the generated sine wave. The bandwidth may be changed by switching in additional capacitance in the filter 706. The desired test sine wave appears at the output of the D/A filter 706 and is directly fed to an output stage 714 which drives the auxillary input of the audio system under test.

For example, when an FM tuner is being tested, the output of the D/A filter 706 is fed to a voltage controlled oscillator (VCO) 715 (using for example Signetics NE566) whose frequency varies with the amplitude of the incoming sine wave, thereby generating a frequency modulated signal. The center frequency of this signal is increased by feeding it into a mixer 716 which also receives the output of an RF oscillator 717 whose frequency will correspond to the sum or difference of the center frequency of the VCO 715 and the desired center frequency or tuned frequency of the output test signal. The output of the mixer 716 therefore produces a signal whose frequency spectrum includes sums and differences of the RF oscillator 717 output and the VCO 715. The output and filter circuit 718 removes all but one of these frequency components, the remaining one being outputed as a monaural test signal for the FM tuner on line 719. Finally, the output and filter circuit 718 may also provide adjustable signal attenuation and a choice of 75 ohm or 300 ohm impedance outputs.

In a similar way, the test signal generated at the output of the D/A filter 706 can be used to generate an AM test signal for AM tuners, or be used to generate other test signals for other specialized program sources.

The test signal generator shown in FIG. 7 is initiated by a start button 720 which sets the start/stop flip-flop 721 (e.g. T.I. SN7474) causing the Reset line 722 to go low, permitting the Sequence counter 723, programmable divider 702 and PROM address counter 703 to begin counting. The sequence is complete when a maximum count reached signal on line 724 from the sequence counter 723 causes the start/stop fip-flop 721 to be switched into the stop state. In addition a power on reset 725 circuit generates a signal for a short duration after the power is turned on to ensure that the start/stop flip-flop 721 is in the stop state when power is first applied to the test signal generation circuit.

A similar block diagram configuration can also be used for the generation of narrow-band noise. One major change is to increase the range of the PROM address counter 703 for example to 2,000 or more counts and increase the number of addressable locations of the waveform PROM 704 (or ROM) correspondingly. The data stored in the waveform PROM 704 is this case would be a sequence of values to generate a noise waveform of restricted bandwidth. For example if a test signal were desired centered on 1,000 Hertz with a spread of plus or minus 10%, then the noise signal could be generated to have frequency components uniformly distributed over the range 900 to 1100 Hertz. Noise generated using such a scheme may have the property that its bandwidth is proportional to the center frequency, and its energy over the band is proportional to frequency. In order to ensure that the energy is constant regardless of center frequency, it is desirable to filter the output with a $-3$ db per octave filter. Alternatively if it is desired to generate a noise test signal having constant band-width, then standard radio frequency frequencing mixing techniques can be used to offset the center frequency of noise having a fixed bandwidth.

Narrow band noise can also be generated by filtering wideband noise. Wide-band noise sources include diodes, high value resistors and pseudo-random noise digital noise sources. The use of wide band noise to generate a narrow band test signal requires that the signal be subsequently band limited, prior to the determination of the signal noise amplitude. Techniques for wide-band noise testing are further discussed with reference to FIG. 30.

E. Generating Band-Limited Impulse Test Signals

Band-limited impulse testing provides a technique for generating a test signal which may be used to generate data to implement a time domain equalizer employing for example, tapped charged couple device arrays (CCD) manufactured for example by Reticon Corp., or bucket brigade storage techniques. Alternatively the response of a band-limited impulse may be Fourier transformed to identify both the frequency response of the audio system and the speakers (generally contained in the first five or six milliseconds of response after the impulse), or of the entire room, in which case the subsequent period of response would be analyzed. The Fourier transform of the audio system's response to the band-limited impulse filter may be used to determine both frequency and phase characteristics to implement the more conventional frequency domain filters tailored to a desired frequency response. These filters may consist of passive elements (inductors, resistors and capacitors) and may in addition use active elements such as op-amps.

FIG. 8 shows a block diagram for the test signal generation of a band-limited impulse. The output 801 of an oscillator 800 (such as Texas Instruments SN74S124) drives both the counter timer 802 and a PROM address counter 803 (both of which may be implemented using T.I. SN74163 binary counters plus SN7400 gates to pass the load signal from the carry output of the counters). The counter timer 802 generates an enabling pulse on line 804 to the PROM address counter 803, at for example, one second intervals and generates a terminating pulse on line 805 to the start/stop flip-flop 806 (e.g. T.I. SN7474) at for example, the end of a five minute test period. The PROM address counter 803 counts the clock pulses on line 801 from the oscillator 800, and the output count of the PROM address counter on lines 807 passes to a waveform PROM 808 (Programmable Read Only Memory e.g. T.I. SN74S287 or ROM). The output of the PROM address counter 803 drives the address lines 807 of the waveform PROM 808. The waveform PROM 808 contains in its successive locations, digital values corresponding to the amplitude of the desired impulse waveform 901, as shown in FIG. 9 where the horizontal axis 902 corresponds to time. Specifically, the graduations on the horizontal axis 902 correspond to the instant of time at which the PROM address counter 803 (FIG. 8) is incremented. For example in FIG. 9, address count 57 of the waveform PROM 808 contains a value equal to 43 which corresponds to the desired amplitude of the impulse waveform at that instant.

Referring again to FIG. 8, the contents of the waveform PROM 808 at each specific address is outputed to a D/A converter 809 to generate a stepwise waveform similar to that shown in FIG. 9. The higher harmonics of this waveform are removed by the D/A filter 810 (FIG. 8) to produce the desired waveform. This waveform is processed using techniques similar to those discussed with reference to FIG. 7 to generate an FM tuner test signal using VCO 811, mixer 812, filter and output circuit 813 and oscillator 814, or generate an auxiliary input test signal via output stage 815.

In a manner similar to the start/stop flip-flop 721 in FIG. 7, the start/stop flip-flop 806 in FIG. 8 is set by a push button 816 to start the generation of the train of impulses. The flip-flop 806 is reset to the stop state by the end of test signal line 805 generated by the counter timer 802, after an appropriate number of pulses have been generated. The power on reset circuit 818 ensures that the start/stop flip-flop 806 is in the stop state when the power is turned on, and the $\overline{Q}$ output 819 of the start/stop flip-flop 806 is used (through the reset line), to reset the counter/timer 802 and PROM address counter 803 to prevent counting until the start/stop flip-flop 806 is switched to its start state.

F. Data Collection

Figure 10:
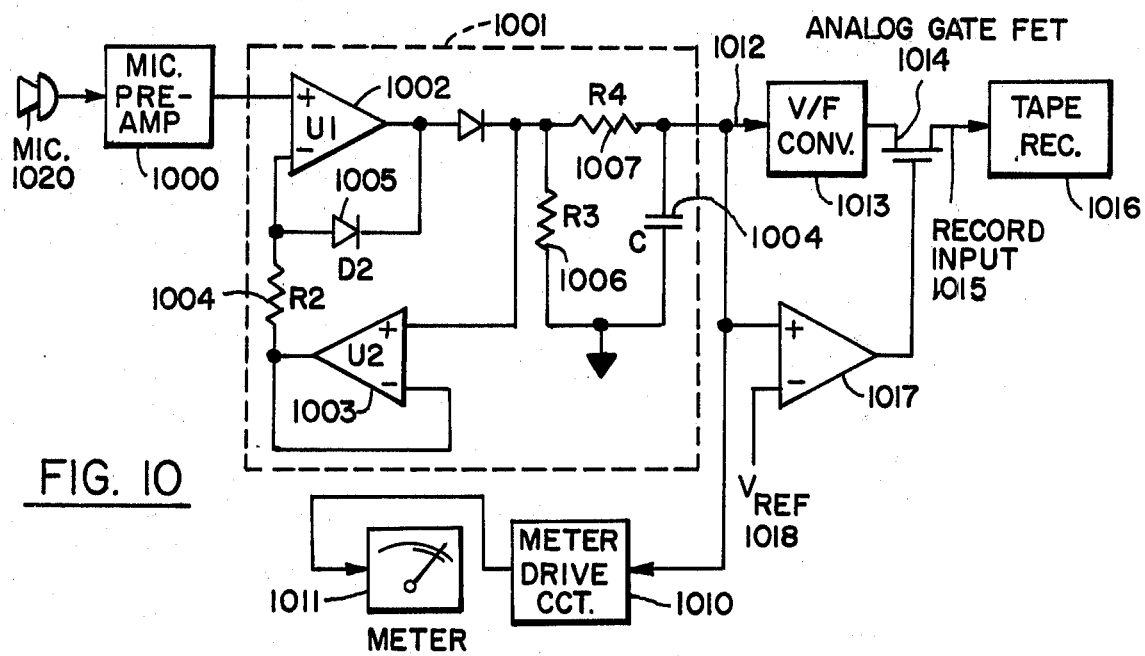
FIG. 10 is a block diagram of a data collection circuit for collecting amplitude data.

The second portion of the test unit termed, the data collection circuit measures and stores the desired parameters of the resulting sound received by the test microphone. This may be done by simply recording the response signal generated by the test microphone, directly into a conventional audio tape recorder. However the limitations of most audio tape recorders are such that directly recording of the response signal does not provide sufficient overall fidelity or amplitude accuracy. For this reason it is desirable to employ signal processing to extract and generate a date signal which can accurately preserve the parameters of the response signal which are of interest. FIG. 10 shows a data collection circuit for storing amplitude information. This circuit may be used when performing sine-wave or narrow band noise testing. The circuit shown in FIG. 10 comprises a conventional low noise, low distortion microphone preamplifier 1000 which amplifies the response signal from the microphone 1020 and passes it to a peak detection circuit 1001. The peak detection circuit comprises two op-amps 1002 and 1003 (e.g. Texas Instruments TL071), diodes D1 and D2, a holding capacitor 1004, and resistors 1006 and 1007. Positive peaks pass through op-amp 1002 to diode 1005a and on to holding capacitor 1004. The amplitude of the signal on holding capacitor 1004 is passed back to op-amp 1003 via a resistor 1004 to the negative input of op-amp 1002. Diode 1005 ensures that when the signal from the microphone preamplifier 1000 into op-amp 1002 falls below the voltage level of capacitor 1004, the output of op-amp 1002 does not swing too far negative to prevent fast response by this op-amp at the onset of the next peak. Resistor 1006 enables the peak signal stored on capacitor 1004 to gradually drain off towards zero level when the incoming signal amplitude is reduced, while resistor 1007, ensures that short transient noise spikes do not dominate the resulting value stored on the capacitor 1004.

The peak value is outputed to a DC coupled meter drive circuit 1010, and thence to a meter 1011 on the front panel of the test unit. This meter may be used to set the output level of the audio system prior to performing the final test.

The output of the peak detector 1001 on line 1012 also passes to a voltage to frequency (V/F) converter 1013 (such as Datel VFV-10K) which generates a data signal whose frequency is proportional to the voltage level on line 1012, and hence via an analog gate FET 1014 (e.g. Harris Corp. HA-201) to the record input 1015 of a tape recorder 1016, which is set to record, thereby storing the various tones of the data signal generated by the voltage to frequency converter 1013 (for example in the range 200 to 7,000 hz.). The purpose of the analog gate FET 1014 is to ensure that during the "off time" between data signal bursts no signal is fed to the tape recorder 1016. The analog gate FET 1014 is turned on whenever the signal from the microphone 1020 exceeds a minimum preset level as detected by comparator 1017 comparing the level on line 1012 to a level $V_{REF}$ on line 1018.

When measuring response using a narrow band noise test signal, it may be desirable to determine average signal power rather than peak value and use this parameter as the measure which passes to the voltage to frequency converter 1013 and thence to the tape recorder 1016. The measurement of average power may be performed by an alternative amplitude detection circuit as shown in FIG. 12. This circuit measures the mean square level of the incoming noise signal. The mean square measurement can often provide a better estimte of noise signal level than does the peak value measured by the peak detector 1001 shown in FIG. 10. The output of microphone 1020 (FIG. 10) passes to the microphone pre-amp. 1000 (FIG. 10), and then to the squaring circuit 1203 (replacing peak detector 1001) which produces an output voltage equal to the square of the incoming voltage from the microphone pre-amp. 1000. This output voltage is then filtered by resistor 1204 and capacitor 1205 which form a filter of sufficiently long time constant to ensure that the output voltage of the filter on line 1206 is constant for a stationary noise input of the lowest audio frequency to be encountered. This signal then passes to the voltage to frequency (V/F) converter 1013 (FIG. 10) to generate a sine wave data signal whose frequency is proportional to the amplitude of the filter output signal on line 1206. The circuit in FIG. 10 in other respects operates as already described.

When testing an audio system using an impulse response test signal, the step of collecting and storing of data involves considerations which are somewhate different from those already discussed. When collecting data to characterize the impulse response, it is necessary to measure and store the shape of the impulse response. Since the impulse response is relatively short, (some tens of milliseconds) the data generated by sampling the response impulse at, for example, a sampling rate of 10 kilohertz to 100 kilohertz results in data being generated at a far greater rate than can be stored on an inexpensive tape recorder.

This problem may be solved in a number of ways. The first invention using a high speed analog to digital converter to sample the impulse response. The data, from the analog to digital converter generated at each sampling point, is then stored in a digital memory. If the digital memory is nonvolatile, (i.e. its contents is preserved even if power is removed) the memory may then be transferred to the processing center and read back into the processing unit.

Alternatively the data collection circuitry may include provision to read out data from the digital memory at a rate compatable with an inexpensive tape recorder. The digital memory output may, for example be converted into an analog signal level, which may be directly fed to line 1012 of FIG. 10 and stored on tape.

Yet another way of processing impulse response data is to perform a single amplitude sample at a predetermined point on each one of a train of impulses. By advancing the sampling point on each successive impulse the impulse amplitude data can be generated at a rate compatable with a tape recorder. A block diagram of a data collection circuit to generate and store data using this technique is shown in FIG. 11.

Figure 13:
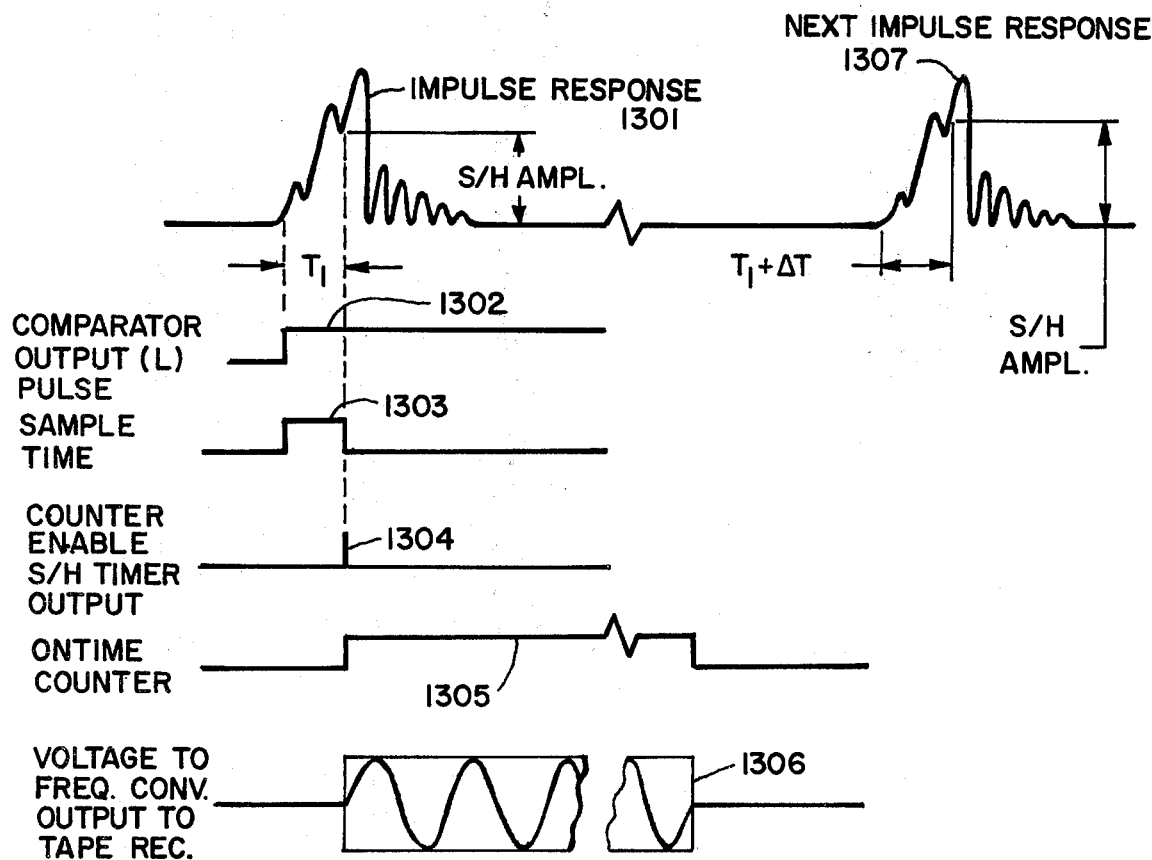
FIG. 13 shows the waveforms generated when collecting impulse response data.

A microphone 1101 receives the resulting sound waves generated by the audio system under test, and produces a signal signal which is amplified in the microphone preamplifier 1102. This signal then passes to a peak detector 1103 (similar, for example to peak detector 1001 shown in FIG. 10), and then to a meter 1104. This meter 1104 is marked to indicate the range of audio amplitude required at the microphone 1101 to assure that the incoming signals fall within the dynamic range of the circuits which are to receive these signals. The user adjusts the volume of his audio system until the meter 1104 is within the marked range. The output from the microphone preamplifier 1102 also passes to a comparator 1105 (for example Fairchild 710 C) which generates a transition at its output when the level of the impulse response at the beginning of the impulse, exceeds the level defined by the reference voltage $V_{REF}$ 1106. This transition from the comparator 1105 is used to set the sample timing flip-flop 1107 (e.g. T.I. SN7474) at the beginning of the impulse response as shown in FIG. 13. The sample timing flip-flop 1107 enables a sample time counter 1108 (comprises of, for example, T.I. SN74163) driven by the oscillator 1109 (e.g. T.I. SN74S124). Counter 1108 counts for a time duration determined by the sequence counter 1110 (which uses for example T.I. SN74163 counter circuits and SN7400 gates). At the end of this time duration the sample time counter 1108 initiates through line 1111 the sample and hold timer 1112 (employing for example T.I. SN74163 circuits) which strobes the sample and hold 1113 (for example Datel SHM-LM-2) to sample the amplitude of the incoming pulse at the instant determined by the sample time counter 1108. This sampled signal then passes to the voltage to frequency converter 1114 (for example Datel VFV-10 M) which generates a data signal having a frequency proportional to the amplitude of the sampled signal. This signal is then recorded by the tape recorder 1116 during the time that the on time counter 1117 (for example using T.I. SN74163) enables the signal from the voltage to frequency converter 1114 to pass to the tape recorder 1116, via the analog gate FET 1115 (comprising for example Harris HA-201). At the completion from the period determined by the on time counter 1117 the analog gate FET 1115 is turned off, and a zero amplitude signal passes to the tape recorder 1116.

At the completion of the data collection and recording cycle the sequence counter 1110 generates an end of sequence signal on line 1118 which forces the stop/start flip-flop 1119 to the stop or reset condition.

The data collection sequence is started when the start/stop flip-flop 1119 (e.g. T.I. SN7474) is placed in the start state by a push button 1120 and this releases the reset (L) signal on line 1121 to the sequence counter 1110 to cause the sequencing counter 1110 to start counting the individual transitions of the sample timing flip-flop 1107. At any instant, the total count of the sequence counter 1110 (corresponding to the number of individual impulse responses occurring since the start/stop flip-flop 1119 was set) is passed to the sample time counter 1108 which determines the period between the comparator 1105 transition and the sample and hold 1113 strobe time from the S/H timer 1112. Thus, the time from the beginning of an impulse response to the sample and hold strobe time, increases by a time equal to one least count period of the sampling time counter 1108 for each one of the succession of impulse response signals received by the microphone 1101.

FIG. 13 shows some of the waveforms generated during the operation of the circuit shown in FIG. 11, to generate and record data corresponding to the amplitude of the impulse response. Referring to FIG. 13 the impulse test signal response 1301 is generated periodically (for example at one second intervals) and the comparator 1105 (FIG. 11) output generates a signal 1302 to set the sample timing flip-flop 1107, causing the sample time counter 1108 enable signal 1303 to go high to enable the sample time counter 1108 to start counting, and when the maximum count is reached the sample and hold (S/H) timer 1112 generates an output pulse 1304 to the sample and hold 1113. A second output of the sample and hold timer 1112 also resets the sample timing flip-flop 1107 and initiates the on time counter 1117 whose output data signal 1305 opens the analog gate FET 1115 to enable the voltage to frequency converter 1114 output signal 1306 to pass to the tape recorder 1116. At the next impulse response 1307 a similar sequence of events occurs except that the sample and hold timer pulse occurs time T1+ΔT after the output transition of the comparator or time ΔT (related to the oscillator 1109 output period) longer than the delayed time T1 shown for the first impulse response 1301 in FIG. 13. Thus, for each impulse received at the microphone 1101 the tape recorder 1116 receives and stores a data signal sine wave burst of frequency proportional to the amplitude of the impulse response at one sampled point.

G. Equalizers

In this section there will be discussed equalizers and equalizer configurations, because before it is possible to establish how the recorded data (corresponding to parameters of the response of the audio system in its environment) are to be processed, it is necessary to establish the type of equalizer which is to be used to correct for deficiencies in the audio system and its environment.

Figure 15A:
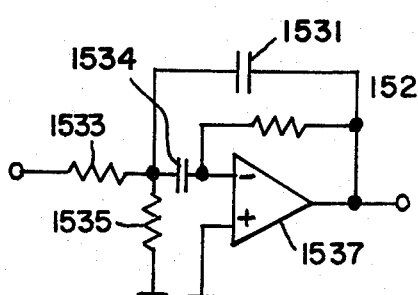
FIG. 15a shows an implementation of a single section of a multi-section frequency equalizer.

A variety of equalizer configurations exist, of which two major types will be discussed here. First there is the type of equalizers which employ tuned circuit sections. Each section has one or more adjustable parameters, which may be set to produce the required frequency response characteristic. The tuned circuits can be connected together in a number of different ways, including series connection, connection in feedback path and parallel connections. FIG. 15 shows a parallel connection of equalizer sections 1503, 1504, 1505, and 1506 (such as shown in FIG. 15a). These sections are fed by a buffer op-amp 1514 (for example T.I. TL071) with input resistor 1501 and feedback resistor 1502. Outputs of the filter sections 1503, 1504, 1505 and 1506 pass through resistors 1507, 1508, 1509 and 1510 respectively and are summed as currents into the output stage, comprising op-amp 1513 and feedback resistor 1512. The center frequencies of each section may be fixed in octave, half octave, third octave or other selected spacings, or may be assigned variable spacings to best tailor the required response to the audio system characteristics.

In addition, both the effective Q of each of the resonant circuits and the amplitude of the circuits' contribution to the overall equalizer response may be adjusted. Equalizers of this type, using tuned circuits set at variable or fixed frequencies are commercially available, or may be readily designed once the appropriate parameters are defined.

Figure 16A:
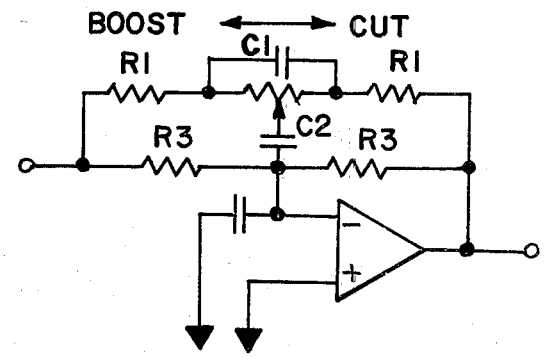
FIG. 16a shows an alternative type of frequency response equalizer section.
Figure 15B:
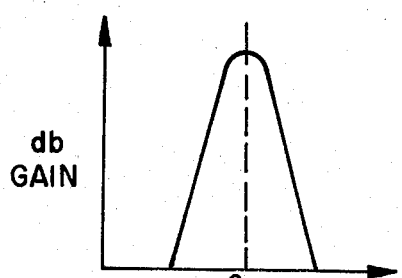
Figure 16B:
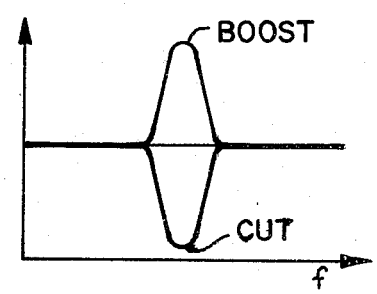

FIG. 15a shows an active filter implementation of a single band pass tuned circuit comprising feedback components C1 1531, R3 1532, forward path components R1 1533, C2 1534 and R2 1535. The op-amp 1537 is for example a T.I. TL071. FIG. 15b shows the typical frequency response of such a circuit. Using this bandpass type of filter sections, each section is responsible for the passage of those signal frequencies around $f_o$ the center frequency of the section. Alternatively, FIG. 16a shows the circuit configuration of a boost/cut equalizer section which can be used in a series connection with other boost/cut sections to form a complete equalizer filter. FIG. 16b shows the response of a boost/cut section. This response is controlled by the setting of the potentiometer in FIG. 16a.

An alternative type of equalizing filter which is now available is based on time domain techniques. FIG. 17 shows a time domain equalizer, in which a tapped audio delay line 1700 based, for example, on CCD, of CID technologies, or on the combination of A/D, digital memory and D/A functions is configured so that the signal at each tap T1, T2, T3, etc., may be added or subtracted, depending on the adjustment ratio, K1 to K10 of the individual potentiometers R1 to R10. At the center position (K–0.5), the same current passes to both positive 1701 and negative 1702 summing nodes, and therefore the tap makes no net contribution to the output 1704. The specific position of each potentiometer R1 to R10 (i.e. the value of K) determines whether the output of a specific potentiometer makes a positive or negative contribution to the output signal 1704 from op-amp U2. For equalizers set by component selection the potentiometers can be replaced by pairs of resistors $R1_A$ and $R1_B$ (FIG. 17b) whose total resistance $R_{TOT}$ is constant but whose values are given by:

$$R1_A = K \cdot R_{TOT}; \; R1_B = (1-K) \cdot R_{TOT}; \text{ and}$$
$$R_{TOT} = R1_A + R1_B$$

Inverting amplifier U1 (for example T.I. TL071) receives at its inverting input the negative summing node, and has a gain determined by feedback resistor R11. The positive summing node connects directly into op-amp U2 (for example T.I. TL071) with feedback resistor R14, as does the output of U1 through resistor R12.

FIGS. 18a and b show diagramatically, the process of correcting an impulse response using time domain equalization. The actual K values of potentiometers R1 through R10 can be derived from appropriate analysis. However, the explanation that follows is simply intended to provide some insight into the principle of time domain equalization. FIG. 18a shows the observed impulse response of the audio system 1801 (solid curve), and the desired response 1802 (dotted curve). FIG. 18b shows the difference response as a smooth curve which may be broken up into 10 time quantized steps, to yield the time quantized difference response. The difference response has been marked off in numbers 10 through 1 corresponding to the number of the potentiometer which would be adjusted to correctly equalize the filter for the observed impulse response 1801 (FIG. 18a). A simplified method for determining the setting "K" of each potentiometer is based on the average height of the difference response in the 10 time steps. The desired potentiometer setting K is equal to 0.5 plus the average height of the difference response in each step divided by the response height in step 6.

As tap number 6 in FIG. 18b corresponds to the peak of the desired response, the K value of resistor R6 would be set so that the full amplitude of the impulse would pass through R6 to the output of U2.

For a detailed explanation of techniques for defining characteristics of time domain filters see for example be found in Blinchikoff, Herman, "Filtering in the Time and Frequency Domain" 1976, Wiley. Procedures providing exact K values will be described subsequently.

Because the time domain equalizer may have poor accuracy at higher frequencies, or because one may wish to use a time domain equalizer and in addition provide correction for room resonances, it is often advantageous to be able to provide both time domain filtering and frequency domain filtering in the same equalizer. The overall characteristic of the equalizer will then be determined by the time domain filter set to correct for certain phase and frequency characteristics and the frequency domain filter set to correct for frequency peaking and other frequency related characteristics.

H. Processing Unit for Sine Waves and Band Limited Noise

As already has been discussed, the adjustment or selection of characteristics, or component values of the equalizer is performed by the processing unit by processing the recorded data derived from the audio system test. The configuration of the processing unit is largely determined by the format and type of recorded data, the type of equalizer, and whether the processing unit operates in an open loop (FIG. 3), closed loop including the equalizer (FIG. 5), or closed loop including the audio system (FIG. 32). Initially the open loop configuration shown in FIG. 3 will be discussed as it relates to frequency amplitude data.

Figure 19:
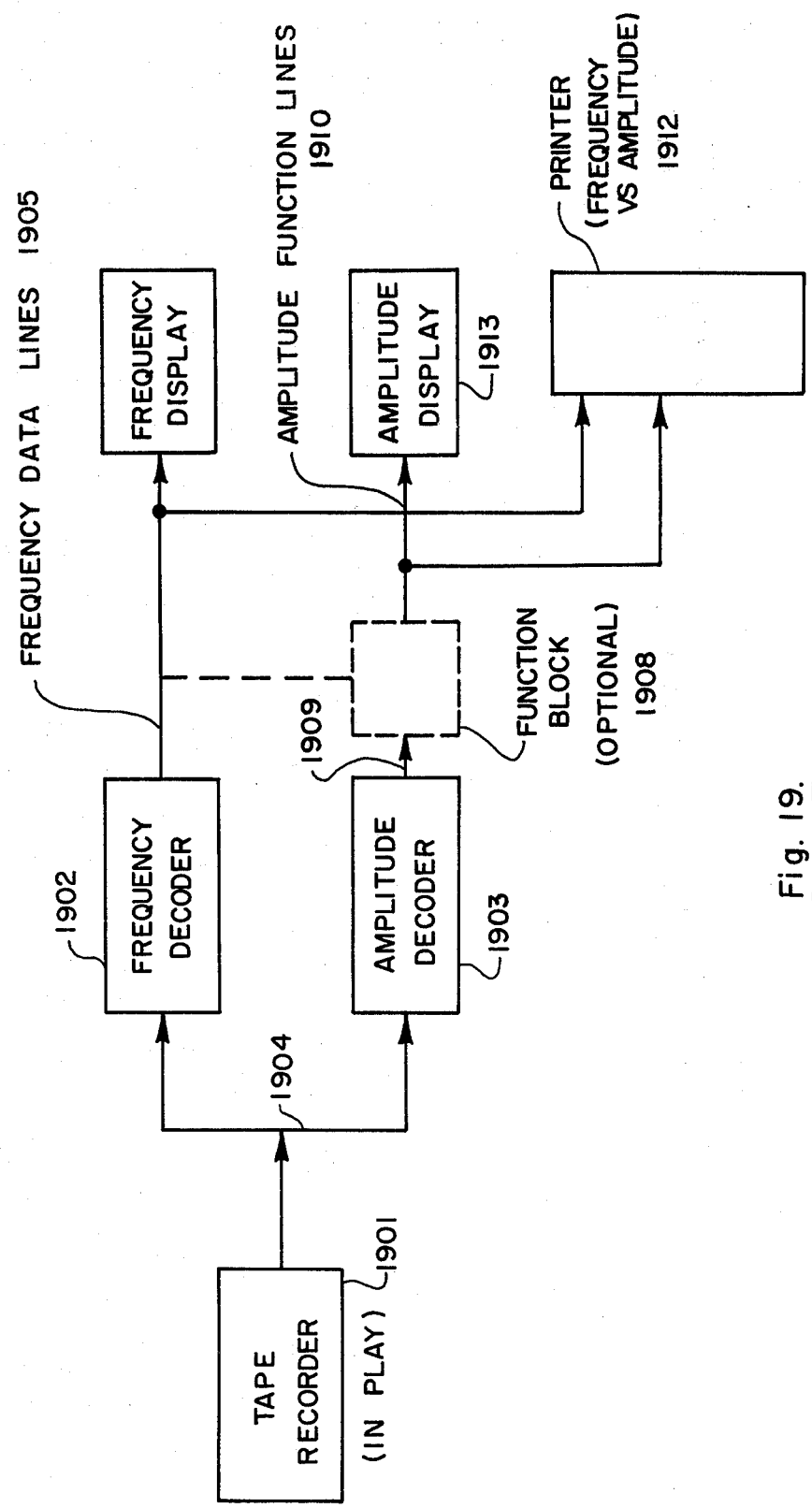
FIG. 19 is a block diagram of a processing unit, based on FIG. 3, for frequency compensation by selection of equalizer components.

FIG. 19 shows a block diagram of the processing unit, based on FIG. 3, for frequency compensation of an equalizer by component selection. A tape recorder (or tape player) 1901 plays back, on line 1904, from the magnetic storage medium the frequency burst data signal generated and stored during the test phase of the audio system and its environment. The waveform of the data signal is shown in FIG. 6. One way in which this signal is generated is from the test signal generation circuit shown in FIG. 7, together with the test unit amplitude recording circuit shown in FIG. 11 operating in response to the resulting audio signals generated by the system under test.

Figure 20:
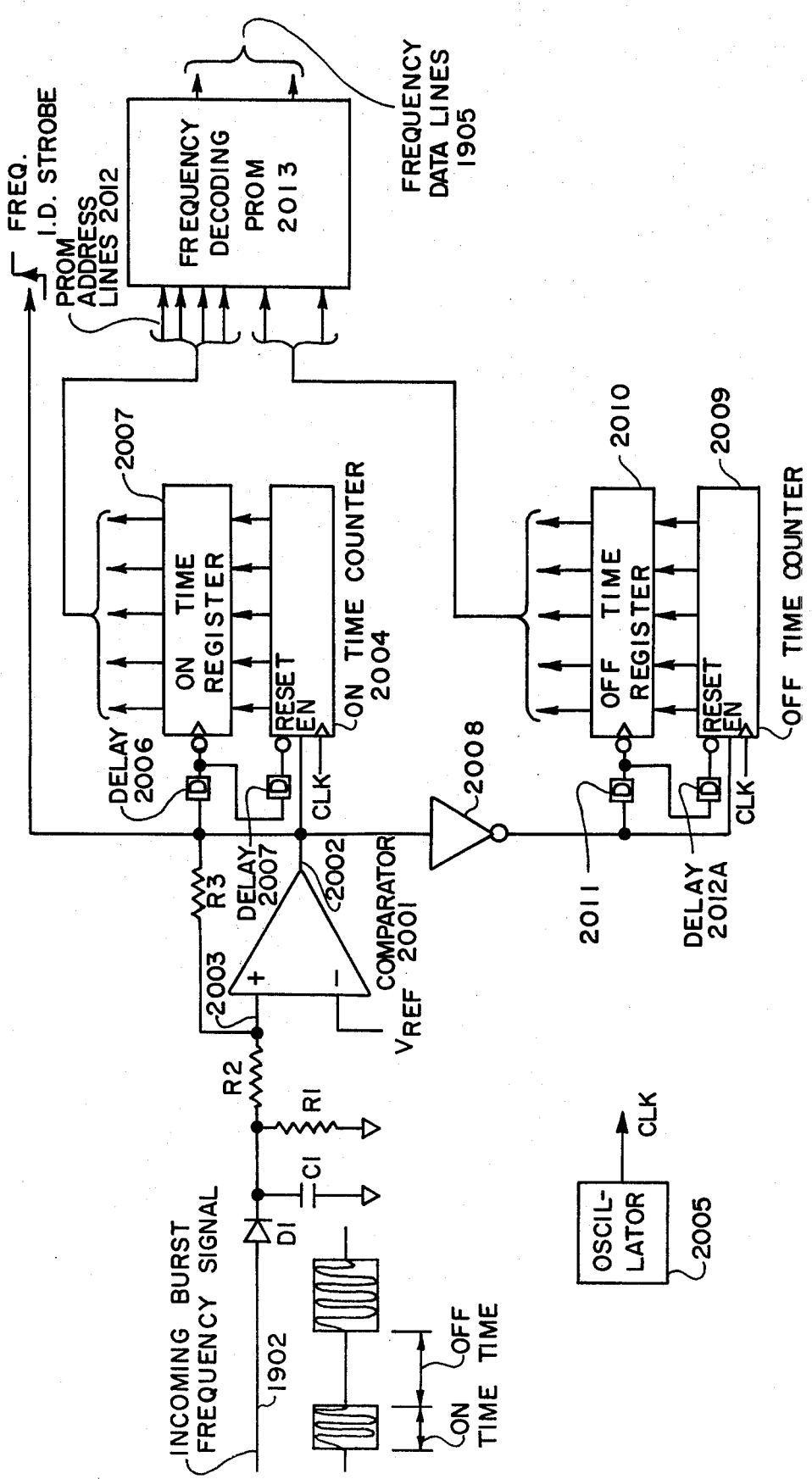
FIG. 20 is a block diagram of a frequency decoder shown in FIG. 19, for decoding the "on time" and "off time" of the test signals.

When generating the test signals for audio system testing, using the test signal generation circuits such as is shown in FIG. 7, frequencies are often chosen to correspond to each of the center frequencies ($f_o$) of the tuned circuit sections in the equalizer designed to be installed in the audio system. The frequency and amplitude decoder blocks, 1902 and 1903 in FIG. 19, decode the recorded test frequency and amplitude data represented by the data signal on line 1904, and generate signals corresponding to these data. FIG. 20 shows one possible implementation of the frequency decoder block 1902 shown in FIG. 19. The purpose of this circuit is to decode "on time" or "on period" of each data signal burst together with the "off time" or "spacing" between each burst to determine the frequency of the test signal response which the data signal burst on line 1904 represents.

Referring to FIG. 20, the incoming burst frequency data signal passes through a peak rectifier circuit comprising components D1, C1, R1 and R2 into a comparator 2001 (such as Fairchild 710 C) which switches to produce a high state at its ouptut 2002 whenever a burst of incoming signal occurs producing a signal at the "+" input 2003 in excess of voltage $V_{REF}$. This high output enables the on time counter 2004 which uses for example T.I. SN74163 circuits to count clock pulses from oscillator 2005 (e.g. T.I. SN743S124) until the incoming burst ceases, at which time the output 2002 of the comparator 2001 goes low stopping the counter 2004 and after a delay time caused by delay 2006 strobes the current contents of the on time counter 2004 (corresponding to the number of clock pulses during the time the comparator 2001 was high) from the counter outputs into the data inputs of the on time register 2007 (comprising for example SN74195 registers operating in the parallel load mode), and finally after a second delay 2007 resetting the counter 2004. At the same time, as a result of the output 2002 of the comparator 2001 going low, the inverter 2008 (e.g. T.I. SN7404) outputs a signal to the off time counter 2009 (similar to the on time counter) which is enabled, and it counts pulses during the "off" or "spacing" between bursts. At the time when the output 2002 of the comparator 2001 again goes high, corresponding to the onset of the next data signal burst, the off time counter 2009 stops and its count data is a short time later (defined by delay 2011) strobed into the off time register 2010 (similar to the on time register 2007), and a further time later the off time counter 2009 is reset by the reset input going low, as a result of delay 2012A receiving the inverted version of the comparator output 2002. At this instant both the on time register 2007 and the off time register 2010 output data corresponding to the last "on time" and last "off time" respectively into the PROM address lines 2012 of the frequency decoding PROM 2013 (e.g. T.I. SN74S287). This frequency decoding PROM 2013 contains a look up table translating the "on time" and "off time" periods into one of a number of possible types of output data. The first of these types is simply frequency data indicating the current test signal frequency under analysis. A second type of data would indicate the number of the equalizer component which influences the equalizer amplitude response at the frequency of the test signal under analysis. For example, in FIG. 14, resistor 1508 determines the amplitude response of frequencies passed by tuned circuit 1504.

Figure 21:
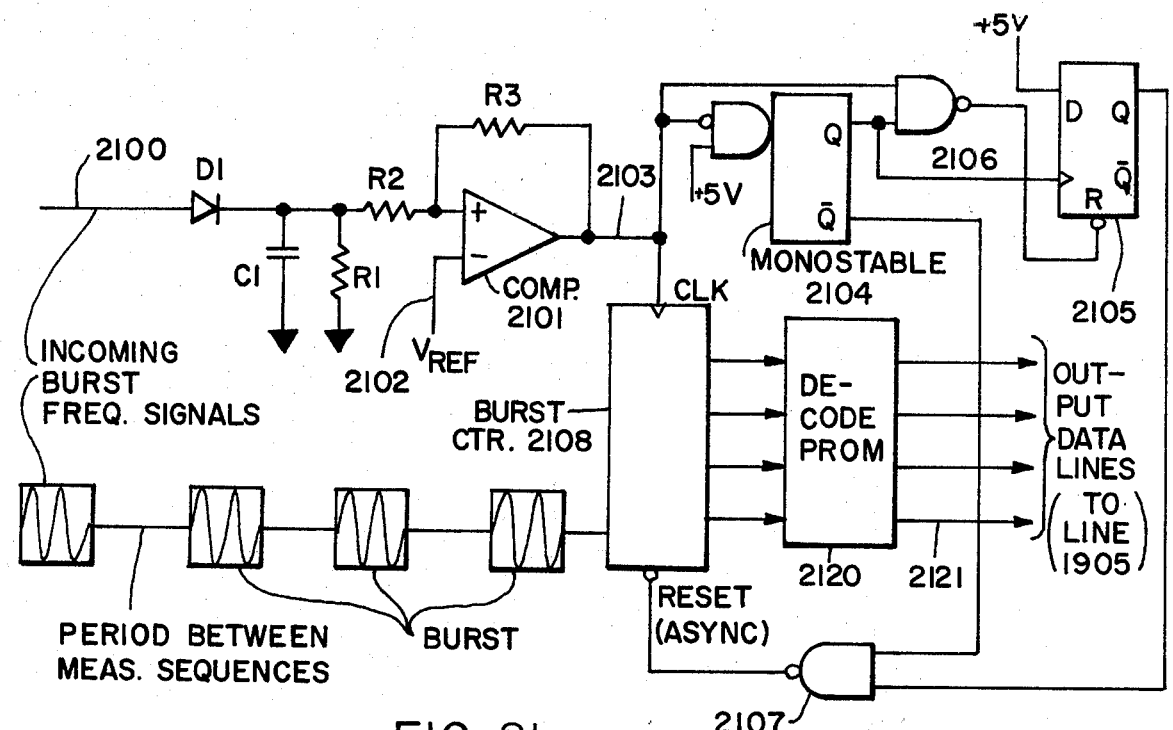
FIG. 21 is a block diagram of a frequency or a sample time decoder, using burst counting.

An alternative technique for determining the test signal frequency which the incoming burst frequency data signal represents is shown in FIG. 21. This method requires that the test signal is so arranged, as to cause the bursts of the incoming frequency data signal to be spaced such that at the beginning of each measurement cycle, a long space occurs between the bursts, and also that the various frequency bursts occurring during a measurement cycle all have a shorter but approximately equal periods.

The incoming burst frequency signal (i.e. data signal) from line 1904 enters the frequency decoder shown in FIG. 21, on line 2100 and passes into an amplitude detector comprising diode D1, bleed off resistor R1, capacitor C1 and passes through R2 into a comparator 2101 (e.g. Fairchild 710C) with hysterisis determined by resistors R2 and R3. The negative input 2102 of the comparator is set to a voltage reference level ($V_{REF}$), chosen so that the incoming burst frequency signals from the tape player 1901 cause the comparator 2101 to produce a high signal at output 2103, while the absence of an incoming signal causes the comparator output 2103 to remain low. The output 2103 of the comparator 2101 passes to a monostable 2104 (such as T.I. SN74123) which triggers on the trailing edge of a burst (i.e., when the "+" comparator 2101 input goes low). The outputs of monostable 2104 in response to a low going signal on line 2103 have a duration greater than the period between consecutive bursts of the incoming burst frequency signal during the measurement cycle, but less than the period between measurement sequences. This monostable 2104 is activated at the end of each burst and upon being activated, causes the D type flip-flop 2105 (e.g. T.I. SN7474) to be set by the Q output of the monostable 2104. Should a burst occur during the time the monostable 2104 has its Q output high, the NAND gate 2106 (e.g. T.I. SN7400) connected to the Q output, "ANDs" the Q output of the monostable 2104 to the output 2103 of the comparator 2101, and this causes the D type flip-flop 2105 to reset. Should no burst occur until after the end of the period when the comparator output 2103 is low, the occurrence of a burst once the monostable 2104 has reset, causes the $\overline{Q}$ output of the monostable 2104 to go high and this output is "ANDed" with the Q output of the D type flip-flop 2105 in a NAND gate 2107 (e.g. T.I. SN7400) whose output causes the burst counter 2108, which counts the number of bursts, to reset.

Thus the burst counter 2108 (which comprises for example SN74177 counters) is set to zero at the beginning of a measurement sequence. On subsequent bursts during the measurement sequence the burst counter 2108 is incremented by one count each time the output of the comparator 2101 goes high and the resulting sum of each count (in other words the number of bursts since the measurement sequence began) is passed to the address inputs of the decoder PROM 2120, which output on its data lines 2121 data corresponding to the current test frequency or alternatively output data corresponding to the number of component in the equalizer whose value will affect the equalizer characteristic for the test frequency from which the current burst of the data signal was derived.

An alternative frequency decoder to that shown in FIG. 21 will be discussed later, but now the amplitude decoder function shown as block 1903 FIG. 19 will be discussed.

A number of techniques can be used for amplitude decoding. These include the use of a phase locked loop to generate a DC voltage level proportional to the frequency of the incoming data signal, or a frequency counting circuit such as shown in block diagram form in FIG. 22. This frequency counting circuit counts for a preset time the number of clock pulses in a single burst and this count is proportional to the frequency of the data signal during the burst. This technique requires that the length of the burst be greater than the counting time.

Figure 22:
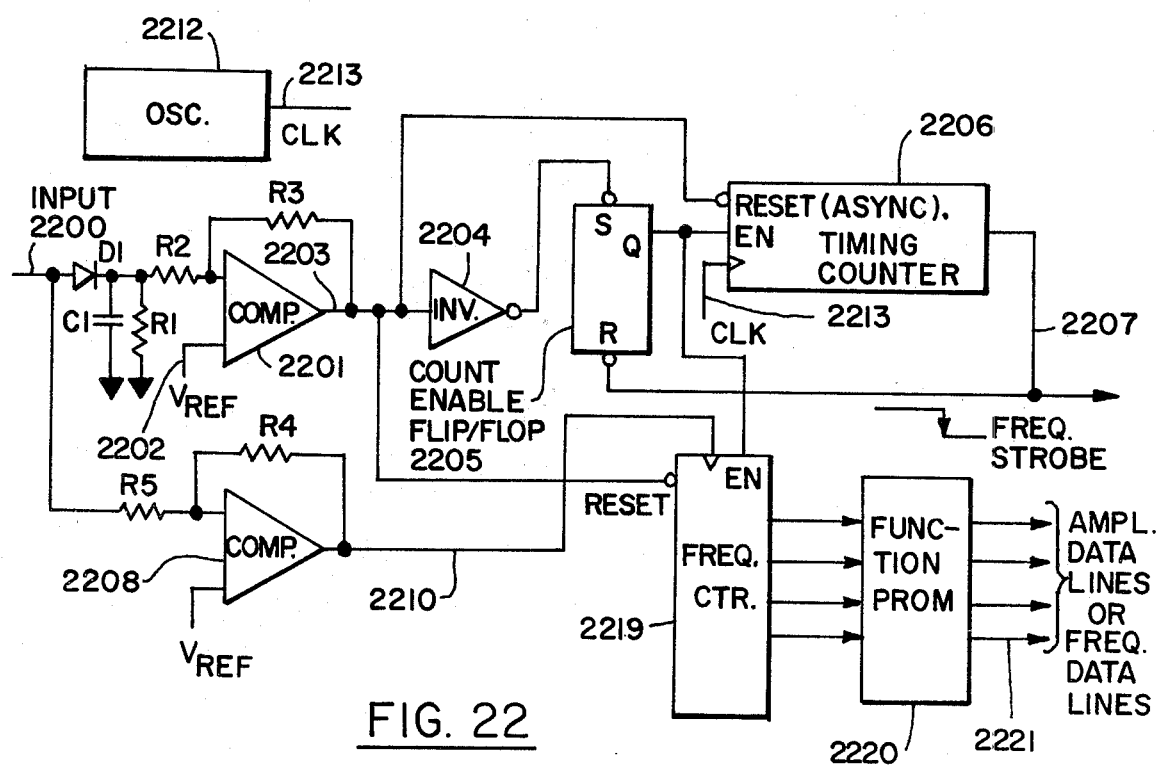
FIG. 22 is a diagram of an amplitude decoder or frequency decoder using a two channel recording technique.

Referring to FIG. 22, the input data signal whose frequency is to be decoded enters at the input line 2200 and passes to the peak detector comprising diode D1, capacitor C1, and bleed resistor R1. The signal across R1 passes through hysteresis resistors R2 and R3 to a comparator 2201 (e.g. Fairchild 710C) whose negative input terminal 2202 is connected to a voltage reference level ($V_{REF1}$), chosen so that the comparator 2201 output 2203 switches high whenever an incoming burst frequency data signal is present. The high output of the comparator 2201 passes through an inverter gate 2204 (e.g. T.I. SN7406) to a count enable flip-flop 2205 (such as T.I. SN7474), causing the flip-flop to be set so that its Q output is high to enable the counting of clock signals by a timing counter 2206 (comprising for example T.I. SN74161). This counter counts a preset number of clock pulses, which are generated by oscillator 2212 (e.g. T.I. SN74LS124) and passed to the counter 2206 on clock line 2213 and, when the preset number is reached, the counter 2206 produces a low going signal at its output 2207 (by inverting the most significant carry output) which resets the count enable flip-flop 2205. During the time the count enable flip-flop 2205 is set, a second counter termed the frequency counter 2219 (using for example T.I. SN74161) is also enabled, and this receives the input signal through comparator 2208 with hysteresis resistors R5 and R4 to provide noise rejection. Comparator 2208 (e.g. Fairchild 710C) has an input voltage $V_{REF2}$ on its negative terminal set so that each incoming sine wave causes a positive pulse at the output 2210 of comparator 2208. The output 2210 of comparator 2208 passes to the clock terminal of the frequency counter 2219 and causes the counter to count from zero until the timing counter generates a count reached signal on line 2207 resets the count enable flip-flop 2205 causing the frequency counter 2219 to stop counting. At this time contents of the frequency counter 2219 will be proportional to the frequency of the incoming data signal.

The output of the frequency counter 2219 is used as the address of the function PROM 2220 for example T.I. SN74S287 (or ROM). The PROM 2220 contains a look up table function to relate the contents of the frequency counter to the digitally coded amplitude information which is presented via lines 2221 to lines 1909 and thence to lines 1910 to the amplitude display 1913 (FIG. 19) or to the printer 1912. Usually this information will either correspond directly to the amplitude of the response signal received by the test unit microphone, or will correspond to the value of the components which are necessary for each section of the equalizer, in order to ensure that the resulting equalizer will correctly compensate for the system and room effects, experimentally measured during the testing phase.

In order that the output 2221 of the function PROM 2220 indicates required component values (e.g. the value of resistor 1508 in FIG. 15), the PROM must be loaded with a look up table which is proportional to the frequency counter contents, (since a reduction in test signal response amplitude requires a reduction of for example the value of resistor 1508) in order to compensate for the reduction in response to the frequency whose amplitude the component influences. This can be calculated for resistors $R_{i1}$ 1507, $R_{i2}$ 1508 and so on shown in the equalizer in FIG. 14, simply from overall audio system and equalizer gain considerations at each equalizing section center frequency.

One example of how these considerations can be expressed mathematically as follows. The center of frequency of the i-th section of the equalizer (FIG. 15) is defined as $f_{oi}$. When generating a test signal at this frequency the microphone sensing the audio signal resulting from this test signal generates a voltage $v_{oi}$, where k is the voltage to frequency conversion factor of the data collection unit.

If for example, the meter reading the amplitude of the response signal is set to its calibration mark by adjustment of the volume control prior to performing the test measurements, and if this setting is performed at a reference test signal frequency of for example 1 kHz, the frequency of the data signal $f_{al}$ recorded for this condition is defined as k $v_{o1}$. Under these conditions the chain of resistors for adjustment of the equalizer in FIG. 15, $R_{i1}$ 1507, $R_{i2}$ 1508, and so on can be defined in terms of $R_{ik}$, the $R_i$ resistor for the 1 kHz section of the equalizer as $$R_{ii} = \frac{kv_{oi}}{kv_{ol}} R_{ik}$$

where $R_{ii}$ is the value of the resistor of the i-th section in FIG. 15.

Thus the look up table of the function PROM 2220 is programmed by loading into the PROM the data corresponding to values of $R_{ii}$ at addresses corresponding to recorded data signal frequencies $f_{ai}=kv_{oi}$, given by $$R_{ii} = \frac{f_{ai}}{kv_{ol}} R_{ik}.$$

Sometimes if band limited noise is used to determine the overall characteristic of the audio system and room environment, it is necessary to ensure that the bandwidth of the equalizing sections used to compensate a specific frequency band is taken into account in determining the required gain at the corresponding center frequency of the band. This requires additional data provided by a function block PROM (comprising for example T.I. SN74S287) shown in FIG. 19 as a dotted block marked function block (optional) 1908 in which the frequency data on line 1905 and the amplitude data on line 1909 each determine a portion of the PROM 1908 address word. The data stored in the functional block (optional) 1908 and outputed into lines 1910 has the effect of compensating the incoming amplitude data for the frequency of observation, to correct for the variations in bandwidth, with the center frequency, of the test noise as well as variations in the frequency response of the microphone or other frequency response variations in the test unit.

Figure 14:
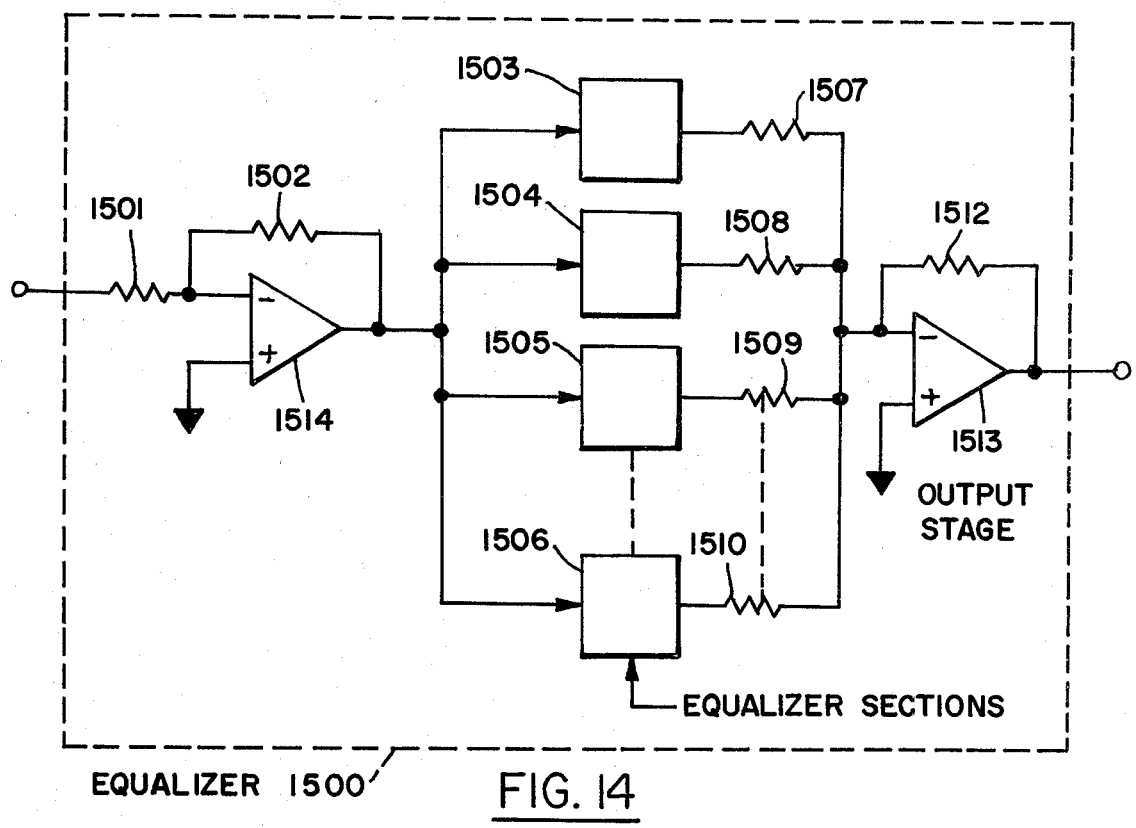
FIG. 14 shows the components of a multi-section frequency equalizer.

In either case the use of the two blocks 1902 and 1903, with or without the function block (optional) 1908, can be used to output data on lines 1905 and 1910 which when fed to the printer 1912 produce a printed list consisting of component number of resistors $R_{i1}$ 1507, $R_{i2}$ 1508, and so on in FIG. 14, together with a tabulation of the value of each of these resistors in order to construct a resulting equalizer to equalize the response of the audio system and its room environment.

An optional technique for storing the test frequency data signal, (which ultimately determines the data appearing on the frequency data Lines 1905) is to use a tape recorder (in, for example FIG. 10 and FIG. 19), which has two channels, such as a stereo recorder. On one channel, the amplitude frequency data generated by the blocks in FIG. 10 is recorded, while on the second channel, the test frequency signal is directly recorded. The amplitude channel then is played back into the amplitude decoder 1903 and the test signal itself is played back directly into the frequency decoder 1902 which uses block diagram as shown in FIG. 22.

When FIG. 22 acts as a frequency decoder, the functional PROM 2220 is used as a look up table to relate each specific frequency to the specific component number of resistors $R_i$ (for example $R_{i1}$ 1507, $R_{i2}$ 1508 and so on) in the equalizing circuit (FIG. 14), in order to output directly on lines 2221 (in this case connected to lines 1905) the component number. Alternatively, frequency data may be outputed directly on lines 2221 from the function PROM 2220.

I. Automatic Equalizer Adjustment

Figure 23:
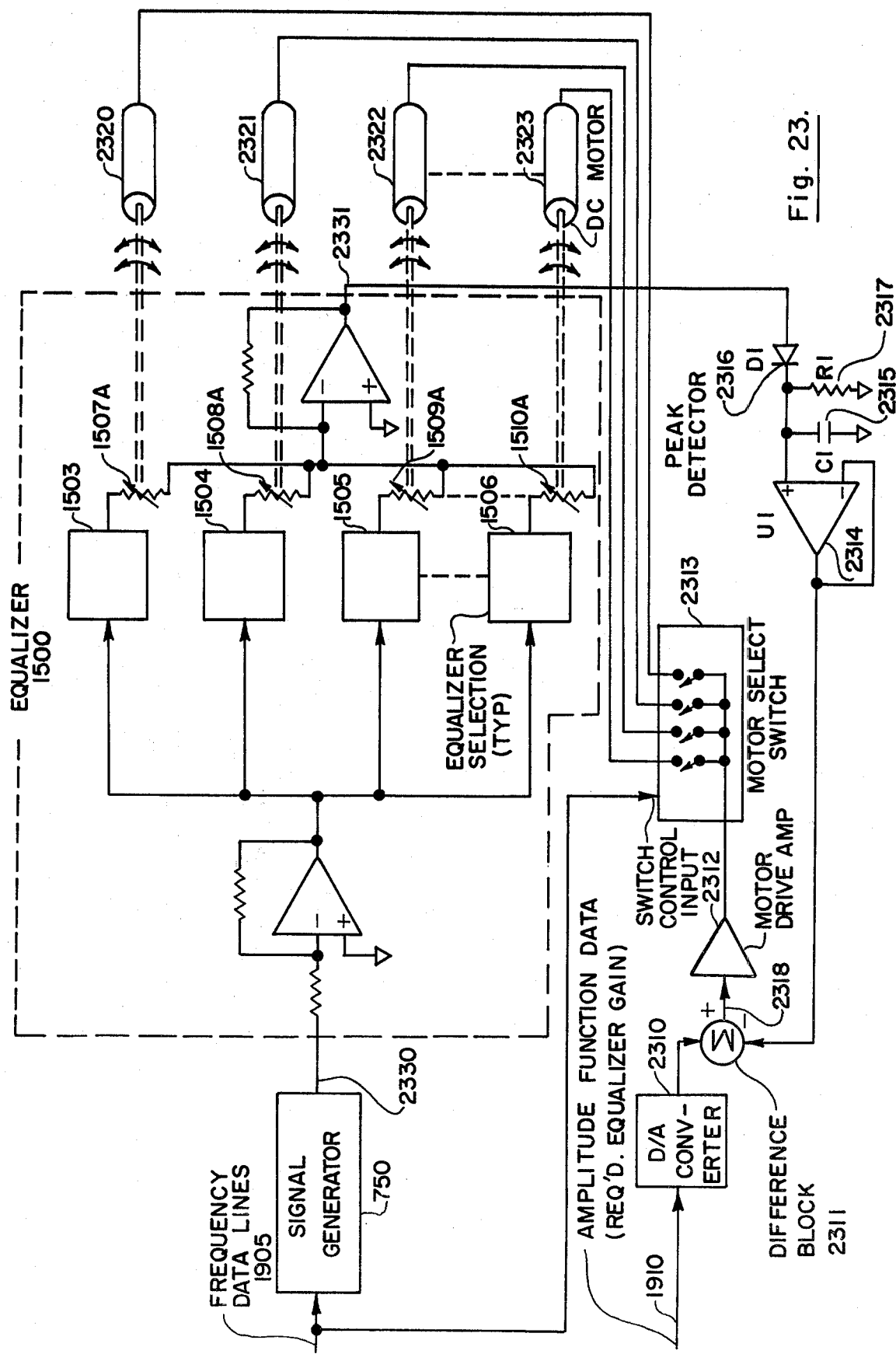
FIG. 23 is a diagram of additional components for automatically adjusting the components of an equalizer to achieve the desired frequency characteristics.

So far there have been discussed methods for automatically specifying component values of an equalizer from room observations. An alternative technique is to use an equalizer in which resistors $R_i$, (in other words the resistors which determine the contribution of each frequency band of the equalizer for example $R_{i1}$ 1507 and $R_{12}$ 1508 FIG. 14) are adjustable either internally as trim potentiometers or as externally adjustable controls to set the equalizer to the desired response. FIG. 23 shows a configuration for automatically adjusting such an equalizer. The adjustable resistors 1507A, 1508A, 1509A to 1510A are each adjusted by motors 2320, 2321, 2322 to 2323, which are not part of the equalizer 1500 but are a portion of the processing unit termed an equalizer adjusting fixture, comprising components 750, 2310 to 2317 and 2320 to 2323. Thus, with the exception of the equalizer 1500 (shown in FIG. 15), all of the components (including the adjusting fixture) shown in FIG. 23 plus the frequency and amplitude decoder, are part of the processing unit.

The shafts of the motors 2320 to 2323 could, when the equalizer 1500 was placed in the fixture, be made to engage with the adjustable potentiometers 1507A to 1510A of the equalizer 1500 so that the motors could control the positions of these potentiometers or controls. The configuration shown in FIG. 23 corresponds to the block diagram shown in FIG. 5. In this case the equalizer parameter control signals are the actual motions of the DC motor drive shafts.

The output data lines 1905 from the frequency decoder (block 1902 shown in FIG. 19 and shown in detail in FIG. 21) pass to the signal generator 750. The decoder PROM 2120 (FIG. 21) is so arranged that when used in conjunction with FIG. 23 the output data on lines 1905 corresponds to the number of the equalizer section centered on the test frequency of the incoming amplitude data on lines 1910. Note that the implementation of this circuit does not require the frequency display 1906, amplitude display 1913 or printer 1912 shown in FIG. 19 but does employ the other components of FIG. 19.

The signal generator 750 comprises components of FIG. 7, lying within the dotted outline 750, including the oscillator 701, sequencing PROM 707, programmable divider 702, PROM Address counter 703, waveform PROM 704, the D/A converter 705, the D/A filter 706 and output stage 714. These components in combination generate a sine wave of frequency corresponding to the center frequency of the original test signal (sine wave or narrow band noise). The frequency data lines 1905 of FIG. 19 and FIG. 23 are connected to lines 708 of signal generator block FIG. 7 and are input to the PROM address of the sequencing PROM 707. When used in FIG. 23 the sequencing PROM 707 contains the data necessary to preset the programmable divider 702, so that the output from output stage 714 onto line 2330 corresponds to sine waves of the desired frequency. These sine waves pass into the equalizer 1500 and then pass to a peak detector comprising diode D1 2316, resistor R1 2317, and capacitor C1 2315. This peak detector is buffered by a voltage follower op-amp U1 2314 (e.g. T.I. TL071) and then passes to a difference block 2311 which produces a signal on line 2318 corresponding to the difference between the output of the D/A converter 2310 and the output of U1 2314. This difference signal then passes to a motor drive amplifier 2312 (comprising a T.I. TL071 op-amp. and power transistors connected as complementary emitter followers).

The motor drive amplifier 2312 generates the signal which drives the DC motors 2320 to 2323. The selection of the DC motor which is activated is determined by the motor select switch assembly 2313 which also receives the frequency data lines 1905. These lines are decoded in the motor select switch assembly 2313 such as by a T.I. SN74142 decoder and this decoder drives, through buffering transistors 2N3643, a relay coil assigned to each of the motors including 2320 to 2323. Activating a relay coil causes the contacts associated with each DC motor to activate the DC motor with the output signal of the motor drive amp 2312. When powered, a DC motor will adjust the associated variable resistor (one of 1507A through 1510A) corresponding to the equalizer section whose center frequency equals the signal frequency generated by the signal generator 750. Thus the value of the selected adjustable resistor is adjusted by closed loop servo system comprising one of 1507A to 1511A, one of 2320 to 2323, and 2311 through 2317, causing the output from the voltage follower 2314 to match the output of the D/A converter 2310. Thus the servo system sequences through the steps of adjusting each variable resistor in the equalizer 1500. This sequence is controlled by the frequency data lines 1905 which indicate data in terms of equalizer section number related to the test frequency.

The amplitude function data on lines 1910 derived from the data signal generated at each test frequency during the audio amplifier and room environment test enters on the lower left of FIG. 23, from the amplitude decoder 1903 (or optionally from the function block [optional] 1908 of FIG. 19). In this configuration the data programmed into the function PROM 2220 (FIG. 22) of the amplitude decoder 1903 corresponds to the required gain output amplitude of the equalizer 1500, specified as a function of the output of the frequency counter 2219 in the amplitude decoder 1903. This data on line 1910 passes into the D/A converter 2310, which produces an analog signal for comparison by the difference block 2311 with the peak output of the equalizer. Thus, as the servo-loop is set up for each equalizer section in turn, the frequency data (line 1905) and amplitude data (line 1910) is stepped through the various center frequencies of the equalizer sections (including 1503 to 1506). At each center frequency, the DC motor of the selected equalizer section is activated as part of the servo-loop adjusts the amplitude at the output 2331 of the equalizer 1500, causing the output of U1 2314 to correspond to the output of the D/A converter 2310, as a result the respective adjustable potentiometer is set to its desired value. Once this process has been performed for all center frequencies, the resulting equalizer 1500 is ready for insertion into the audio system, from which the test data was obtained.

There are alternative ways to that shown in FIG. 23, of adjusting an equalizer. These included adjustments of the Q, the center frequency and the gain of each section, of the equalizer to match an experimentally determined frequency response. The techniques used here are similar to those used in FIG. 23, except that in these cases the variables under adjustment will tend to interact, and therefore the adjustment procedure will be more complex. Provided a set of variables are chosen which allow interaction, but with each itertion converge (that is to say, the adjustment of all variables is repeated a number of times until a final stable value is found), a technique similar to FIG. 23 can be used with other variables of the equalizer. In some cases in spite of repeated adjustments, the variables may not converge to a stable value. Then an alternative technique which includes within the loop servo, a computer to execute a multiple least squares regression or a linear programming solution to determine the best fit of the frequency response using available equalizer sections with appropriate adjusted parameters may be employed. The techniques and general principles of multi-parameter optimization of generalized systems are well documented in a variety of texts. One such reference is Carnahan, Brice "Digital Computing and Numerical Methods", John Wiley & Sons 1973, Chapters 8 through 10.

Figure 24:
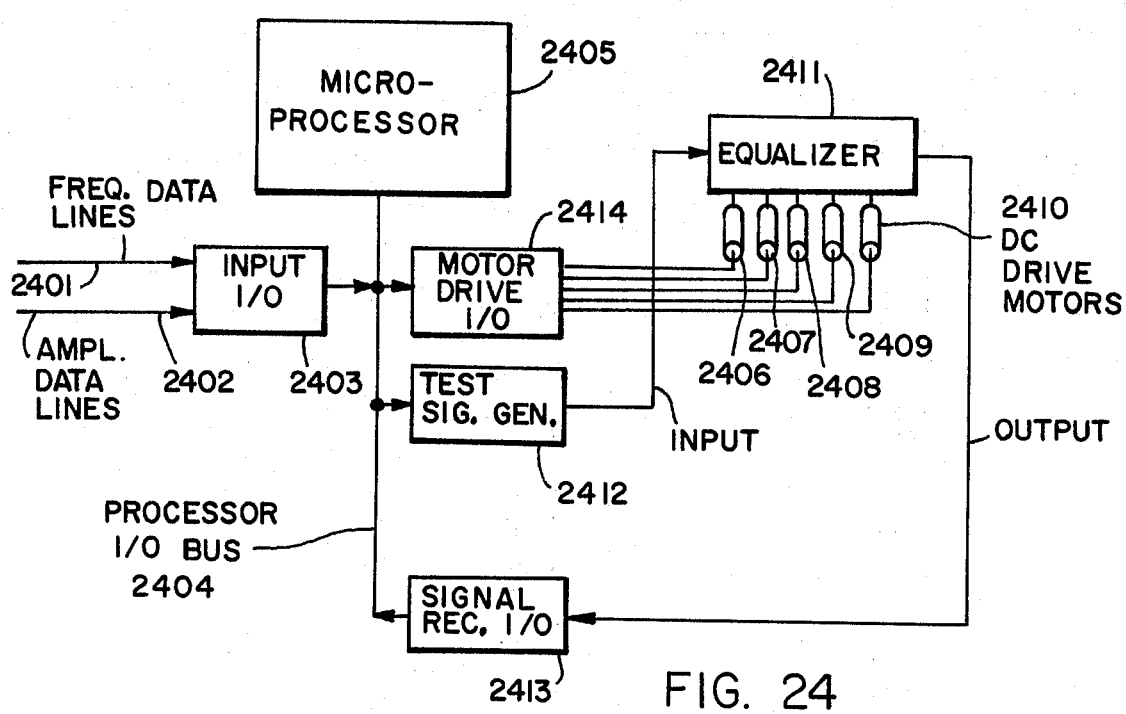
FIG. 24 shows a system using a microprocessor for the adjustment of an equalizer to achieve the desired characteristics.

An example of a computer based configuration is shown in the block diagram in FIG. 24 where the frequency and amplitude data lines 2401 and 2402 are passed to the input I/O (input output) block 2403 and then to the I/O bus 2404 of a microprocessor 2405 which receives the audio system test data and stores it in the microprocessor 2405 memory. The microprocessor 2405 communicates via the I/O bus 2404 to generate data to adjust one or more DC drive motors 2406 to 2410 while stimulating the equalizer 2411 through the microprocessor 2405 controlled test signal generator 2412 and signal receiver I/O 2413 thereby characterizing the response of the equalizer 2411 at each instant during the adjustment process.

The I/O bus 2404 communicates data between the microprocessor 2405 and I/O devices 2403, 2414, 2412 and 2413. The microprocessor 2405 (for example Zilog Z80) receives the audio system test response data through the input I/O 2403 and stores this data in its memory. A general relationship program describing the transfer function corresponding to the change in transfer response to the equalizer 2411 as a function of the signals sent to motors 2406, 2407, 2408, 2409 and 2410 is programmed into the microprocessor 2405 program memory. This program is arranged to control the DC drive motors 2406 to 2410 to adjust the parameters of the equalizer 2411 to adjust the equalizer response in predetermined way.

The microprocessor 2405 executes a program to activate the test signal generator 2412 and receives, via the signal receiver I/O circuit 2413, data corresponding to the response of equalizer 2411 responding to the output of test signal generator 2412. This equalizer response data is passed to the microprocessor 2405 as a characterization of the equalizer 2411 response. The equalizer 2411 response data is processed by the microprocessor 2405, together with the audio system test data received from the input I/O 2403 and stored in the microprocessor 2405 memory, to produce an estimated simulated system response corresponding to the response of the audio system with the equalizer 2411 installed. This processing step involves multiplying the amplitude response of audio system (characterized by the aduio system test data) and the amplitude response to the equalizer together at each frequency to produce a simulated system response. Errors between the desired system response and the simulated system response are analyzed using an appropriate analysis program and the results of this program are used by the general relationship program to adjust the response characteristic of equalizer 2411 by means of the DC drive motors 2406 to 2410 controlled by the microprocessor 2405 through the motor drive I/O 2414.

Once this adjustment is complete the equalizer 2411 is again stimulated by the test signal generator 2412 and the response data is passed back to the microprocessor 2405 via the signal receiver I/O 2413. This response is again processed with the stored audio system test data and the result is again used to provide further information to again adjust the equalizer 2411 parameters through DC drive motors 2406 to 2410 and motor drive I/O 2414. This process may be iteratively repeated until the simulated system response lies within an acceptable tolerance band of the desired response. The technique illustrated in FIG. 24 may also be used for time domain equalizers.

J. Equalizer Implementation Using Impulse Response Data

Figure 25:
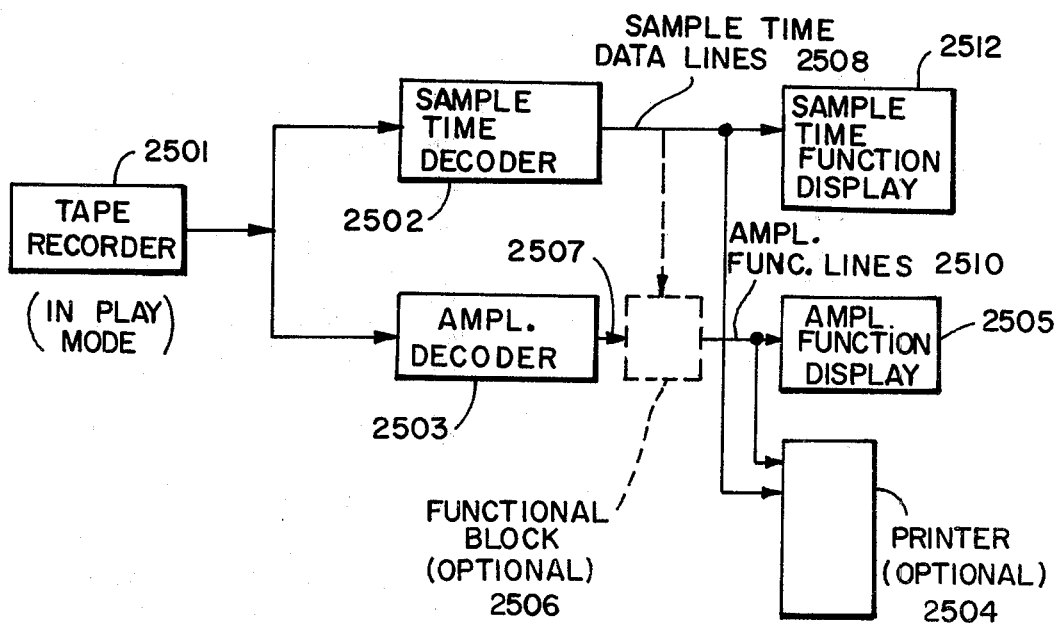
FIG. 25 shows a block diagram of a processing unit based on FIG. 3 for time domain compensation by component selection.

As already discussed, with reference to FIGS. 8, 9, 11 and 13, characterization of the audio system and room response can also be performed using impulse testing techniques. These testing techniques can be used to define the characteristics of time domain equalizers, or by Fourier transformation, the response data can be used to define the frequency as well as phase characteristics of the desired tuned section or multiband equalizer. FIG. 25 shows a block diagram of a processing unit based on FIG. 3 for time domain compensation by component selection. The circuit operates in a manner similar to that in FIG. 19 except that it is now necessary to use a sample time decoder 2502, rather than a frequency decoder (1902 in FIG. 19) in order to identify the position, with respect to the start of the impulse, of each of the samples recorded as frequency bursts on the tape recorder 2501 using the configuration shown in FIG. 13. The data on line 2507 from the amplitude decoder 2503 is used to determine the potentiometer setting K (FIG. 17a) or the value of the resistors FIG. 17b, while the sample time decoder 2502 is used to identify which potentiometer or which pair of resistors is specified in the equalizer shown in FIG. 17a. Specifically, in implementing the equalizer, fixed resistor values can be determined (FIG. 17b) or the ratio of K of the potentiometers (FIG. 17a), can be determined from the recorded data signal amplitude from the tape recorder 2501. The sample time decoder 2502 can be implemented by counting the number of frequency bursts in the data signal using the same configuration as shown in FIG. 21. The decode PROM 2120 decodes sample time Data from the count of incoming frequency bursts of the data signal, and the output data lines 2121 output sample time data onto lines 2508 (FIG. 25). Specifically, each frequency burst is counted in counter 2108 and the count is used to generate the sample time Data by translation through the decode PROM 2120 onto output data lines 2121 (in the same way as was described to decode the frequency data). The decode PROM 2120 in the sample time decoder, is loaded with data relating the output of the burst counter 2108 to the number of the component which primarily affects the amplitude which the frequency burst corresponds to in the equalizer shown in FIG. 17a. This sample time data is presented on the sample time function display 2512 or printer 2504 via lines 2508.

The amplitude decoder 2503 (FIG. 25) performs the same function as that shown in detail in FIG. 22 and the same configuration may be used. In this case the data in the function PROM 2220 (FIG. 22) of the amplitude decoder, will correspond to the calculated ratio (K) or the resistor values desired, and this data on lines 2221, passes to line 2507 and can be printed out on the printer 2504 or displayed on the amplitude function display 2505. The purpose of the function block (optional) 2506 (with output lines 2510) is to permit (if desired) the modification of amplitude data on line 2507 as a function of the time the impulse was sampled in order to modify the effective shape of the impulse function. The functional block 2506 may comprise a lock-up table implemented in a PROM or ROM (e.g. T. I. SN74S287) to modify the amplitude data on lines 2507 either multiplicatively, additively or as some other function of the sample time data on lines 2508. Thus the processing unit shown in FIG. 25 can be used to produce a listing of potentiometer number and ratio value K (FIG. 17a) or values of the fixed resistors (FIG. 17b) on printer 2504 to thereby implement in a time domain equalizer the desired response.

FIG. 26 shows a block diagram of an automatic processing unit circuit for time domain equalization. Basically this circuit implements techniques which are similar to those described with respect to FIG. 23 in that potentiometer drive motors (M1, M2, etc.) are used to adjust the adjustable potentiometers of the time domain equalier 2603 (shown in detail in FIG. 17a) in a feedback loop implementing the technique initially outlined in FIG. 5. The circuit shown in FIG. 26 receives on lines 2606 connected to the sample time decoder 2502 shown in FIG. 26, sample time data corresponding to the time of sampling the impulse response. The lines 2606 are connected to sample time decoder output lines 2508 (in FIG. 25). FIG. 26, also receives amplitude data on amplitude data lines 2610 connected to amplitude decoder 2503 shown in FIG. 25. This data corresponds to the amplitude of the impulse response at the time defined by the sample data time lines 2606.

The test signal generator 2602 (shown in detail in FIG. 27) on command from the sequencer 2620 generates a signal comprising a predetermined number of impulse test waves (corresponding to the impulse signal used to originally test the audio system) for a period sufficiently long to enable a selected potentiometer drive motor (one of M1, M2, etc. in FIG. 26) to adjust its specific potentiometer of the time domain equalizer 2603. This is achieved by generating, in response to each pulse on the test signal initiate line 2601, a predetermined number (determined by the impulse counter 2701 in FIG. 27) of impulse test waves. The sample time data strobe pulse on line 2601 sets the enable flip-flop 2702 (e.g. T. I. 7474) to enable the PROM address counter 2703 (comprising T. I. SN74163) in a manner similar to that already described with respect to FIG. 8. The PROM address counter 2703 counts clocks on line 2623 and drives a waveform PROM 2704 (comprising T. I. SN74S287) which in turn drive a D/A converter 2705 (e.g. DATEL DAC-6921B) to generate the required impulse test wave shape. This is filtered in a D/A filter 2706 to remove digitization noise. At the completion of the generation of each impulse test wave (with appropriate impulse spacing) a pulse is generated on a maximum count reached (L) line 2707 by the PROM address counter 2703 (comprising T. I. SN74163) and this pulse increments the impulse counter 2701 which also uses T. I. SN74163 integrated circuits.

Referring to FIG. 26, impulse test waves generated by the test signal generator 2602 pass to the time domain equalizer 2603 and from the equalizer 2603 to a sample and hold circuit 2604 (e.g. DATEL SHM-LM-2) which samples the amplitude of the resulting impulse at an instant during the occurrence of the impulse. The time at which the sampling occurs is controlled by the data on the sample sequence lines 2621, which are parallel loaded into the sample time counter 2607 to determine the specific number of clock pulses to be counted from when the sample time flip-flop 2608 enables the sample time counter 2607 to begin counting, to when it outputs a maximum count reached pulse on line 2609 to the sample and hold timer 2610. The clock signal 2623 from oscillator 2624 drives the sample time counter 2623. The output of the S/H timer 2610 on line 2611 strobes the sample and hold 2604 to sample the impulse response on line 2612 from the equalizer 2603. The sample time flip-flop 2608 enables the sample time counter 2607 when the test signal initiate line 2601 sets the sample timing flip-flop 2608. The sampled voltage passes from the sample and hold 2604 on line 2613 into the difference block 2614 which compares the output of the D/A converter 2615 with the output of the sample and hold 2604 and sends a difference signal to the motor drive Amplifier 2616. The output of the motor drive amplifier 2616 passes to the selected potentiometer drive motor via the motor switch block 2617 which selects, based on the sample sequence lines 2606, which one of the motors M1, M2, etc., are to adjust its corresponding potentiometer of the equalizer 2603 which affects the amplitude of the point on the impulse which the sample and hold 2604 circuit is presently sampling.

The output of the D/A converter 2615 is determined by processing the amplitude data on lines 2610 in the inverse function block 2618 and passing it to the D/A converter 2615.

The inverse function block 2618 generates data corresponding to the inverse of the impulse amplitude function presented on lines 2610. This is achieved by the inverse function block 2618 performing the following steps:

(1) Under control of the sequencer 2620, receiving and storing sample time data on lines 2606 and the corresponding amplitude data on lines 2610.

(2) Computing the Fourier frequency transform F(f) of the stored data, where f is defined as frequency.

(3) Taking the reciprocal 1/F(f) of the Fourier transform F(f).

(4) Computing the inverse Fourier transform of 1/F(f).

(5) Outputting, under control of data on the sample sequence lines 2621 generated by the sequencer 2620, amplitude data corresponding to the inverse Fourier transform of 1/F(f), to the D/A converter 2615.

Returning now to the overall operation of FIG. 26. If at a sampled point on the impulse output from the equalizer 2603 the amplitude is determined to be below the amplitude of the output of the D/A converter 2615, this is corrected by increasing the output from the time domain equalizer 2603 at the corresponding tap. This requirement for an increased output is met by the selected potentiometer drive motor (selected by the motor Switch block 2617), adjusting the output of the time domain filter 2603 to effect an incrase in the impulse output at the sampled point.

During the time that servo loop comprising the time domain equalizer 2603, the sample and hold 2604, the difference block 2614, the motor drive amplifier 2616, the motor switch block 2617 and selected potentiometer drive motor is adjusting the selected equalizer potentiometer by sampling repeated pulses from the test signal generator 2602, it is necessary that the output of the D/A converter 2615 is held at a constant level. This is achieved by ensuring that the output of the inverse function block 2618, controlled by the sequencer 2620, is stable for a sufficiently long time to allow the servo loop to stabilize.

The technique illustrated in FIG. 26 has the disadvantage that it requires the inverse function of the impulse response be calculated. An alternative configuration for the system shown in FIG. 26 provides a means for simulating the audio system under test and does not require the inverse calculation. This alternative configuration involves the use of a test signal generator 2602 similar to the one shown in FIG. 27, except with the following changes:

(1) The waveform PROM 2704 is replaced by a waveform RAM (e.g. T. I. SN74207) which is loaded with the impulse response profile data defined by the sample time data on lines 2508 and amplitude data on lines 2507 generated in FIG. 25. This is achieved by programming appropriate data in the function PROMs of the sample time decoder (FIG. 21) and amplitude decoder (FIG. 22) so that digital data can be produced by these decoders corresponding directly to the impulse response waveform. Reading the data from the waveform RAm (replacing the waveform PROM 2704) allows the test signal generator in FIG. 26 to output into the time domain equalizer 2603 a signal having the same shape as the impulse response signal produced by the audio system under test.

(2) The inverse function block 2618 and D/A converter 2615 are replaced with a waveform PROM 2801 (e.g. T. I. SN74S287) and D/A converter 2802 (e.g. DATEL DAC-HK12BGC) shown in FIG. 28. Connection lines 2606 and 2610 are no longer required. The waveform PROM 2801 is loaded with data corresponding to the profile of the test impulse test wave used to originally test the audio system and accessed by the sample time data lines.

The overall operation of this alternative configuration causes the time domain equalizer 2603 (FIG. 26) to be adjusted so that in response to the impulse signal from the waveform RAM (replacing the waveform PROM 2704) the equalizer 2603 produces an output corresponding to the original impulse test wave used to test the audio system. The servo loop therefore adjusts the equalizer 2603 is set to meet these requirements, so that when the resulting equalizer 2603 is inserted into the audio system, it will produce optimum equalization. More than one complete adjusting cycle (comprising stepping through each of the amplitude adjustment points and adjusting each corresponding potentiometer) may be required to produce optimum results.

A further way to use the impulse response data is shown in FIG. 29. Items identical to those in FIG. 25 have the same identification numbers as are used in FIG. 25. The data from the sample time decoder 2502 and amplitude decoder 2503, corresponding to the sample time points and signal amplitudes at the sample time points is passed to a Fourier transform processor 2901. The processor 2901 using, for example, fast Fourier transform techniques, performs the Fourier transform of the impulse response, and outputs frequency data on lines 2903 and amplitude data on lines 2905 corresponding to the frequency spectrum of the impulse response. Consequently, provided an appropriate test impulse is used having a uniform frequency response over the range of interest, the frequency spectrum of the impulse response will correspond to that of the audio system. This can be outputted to the frequency display 2902 and amplitude display 2903 as well as to a printer 2904, in either the form of a frequency spectrum, or by passing the data through decode and function PROMs (not shown) in series with lines 2903 and 2905, to transform the data into the form of component numbers and component values of a frequency domain multi-band equalizer having the desired characteristics. Alternatively data on lines 2903 and 2905 may be used in conjunction with the function shown in FIG. 23 to automatically adjust an equalizer.

K. Automatic Equalization Using Wide-Band Noise

Figure 30:
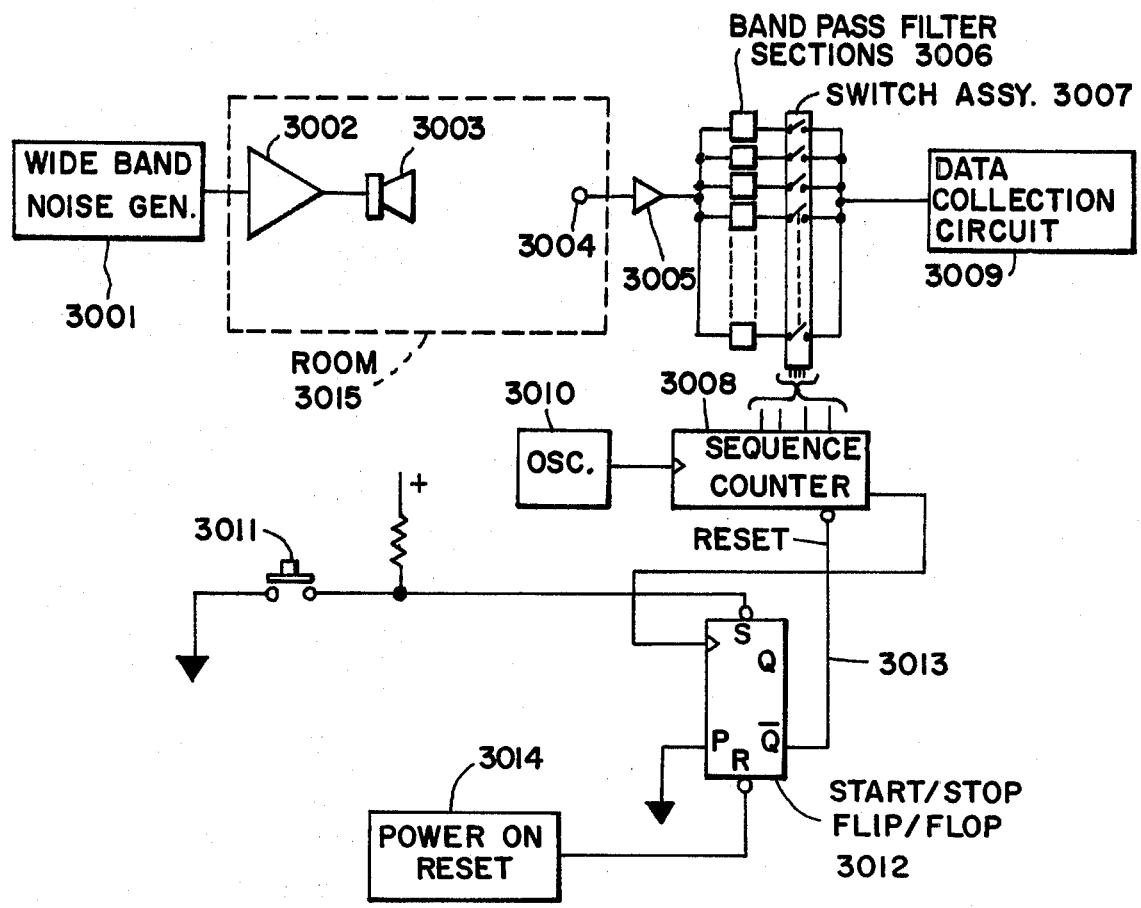
FIG. 30 shows a complete test unit with audio system under test for sequentially testing using wide band noise.

Automatic equalization can also be performed using wideband noise test signals. Wide-band noise provides techniques for checking the entire spectrum either simultaneously, or sequentially in a manner similar to the methods already discussed for testing using sine waves and narrow-band noise. Testing and data collection using wide-band noise can be implemented using a block diagram as shown in FIG. 30. This system is based on the technique shown in FIG. 2. The wide-band noise generator 3001 generates a test signal which is fed to the audio system under test comprising the audio amplifier under test 3002, and loudspeaker 3003 in the room 3015. The microphone 3004 receiving the resulting sound from the loudspeaker 3003 and its room 3015 environment generates a response signal which is amplified by the microphone preamplifier 3005. Its output then passes to a number of bandpass filter sections 3006 having characteristics which will, in general, be similar to the filter sections of the equalizer which is to be installed in the amplifier system. Thus the bandpass filter sections 3006 may, for example, be octave or ⅓rd octave bandpass filters with appropriate Q values and center frequencies $F_0$. The output of each of the bandpass filter section 3006 passes to a switch assembly 3007 externally controlled by the sequence counter 3008 so that at predetermined periods one of the switches is closed to generate a signal burst to pass to the data collection circuit 3009. The data collection circuit 3009 is as shown in FIG. 10 (with the exception of the Mic. preamp.), comprising a peak detector 1001 (or square law detector shown in FIG. 12), voltage to frequency (V/F) converter 1013, FET 1014 comparator 1017 tape recorder 1016, meter drive circuit 1010 and meter 1011.

The sequence counter 3008 (comprising T.I. SN74163) in FIG. 30, is driven by an oscillator 3010 (e.g. T.I. SN74LS124). The sequence begins when the start button 3011 is pressed, causing the start/stop flip-flop 3012 (e.e. T.I. SN7474) to be set, thereby enabling sequence counter 3008 to begin counting and generate control signals to operate the switch assembly 3007 (comprising T.I. SN7442 and RCA CD4046B), thereby sending a sequence of burst signals to the data collection circuit 3009. The power on reset circuit 3014 generates a low signal when power is turned on, to ensure that the start/stop flip-flop 3012 is in the reset or stop condition at turn on time. The data generated and stored by the data collection circuit 3009 may be used in conjunction with, for example, FIG. 19 to implement a frequency domain equalizer.

A wideband equalizing circuit for automatic equalizer adjustment in direct response to test signals is shown in block diagram form in FIG. 32. The wideband noise generator 3201 generates the test noise signal which passes to an adjustable equalizer 3202 to which are connected DC motors M1, M2, etc. to drive the adjustment potentiometers of equalizer 3202. Each DC motor M1, M2, etc. is driven by a DC motor amplifier A1, etc. which has two inputs. When the high AH1 input is asserted the DC motor amplifier A1 drives the DC motor M1 to reduce the output of the section of the equalizer 3202 to which the DC motor M1 is connected. The output signal from the equalizer 3202 next passes to the audio amplifier 3203 under test and thence to the loudspeaker 3204, which generates resulting sound waves which are picked up by the microphone 3205 which generates electrical response signals. These electrical response signals are amplified in the microphone amplifier 3206. The output of the microphone amplifier 3206 passes to the filter and comparator function 3207. This function comprises a number of filters and comparators connected in sections. One such section is shown in FIG. 33. The signal comes from the microphone preamplifier 3206 and passes through a bandpass filter 3301 (see for example FIG. 15) whose characteristics, including center frequence and Q value, are similar to the characteristics of the filter sections in the equalizer. The output of the bandpass filter 3301 corresponds to the spectral component of the noise test signal which lies within the range of the bandpass filter 3301 and this output passes to the squarer and filter 3302 section which squares the incoming signal and filters it in a manner similar to that shown in FIG. 12 (possibly less effectively the squarer and filter 3302 could be replaced with a peak detector circuit 1001 as shown in FIG. 10, at slightly lower cost). The signal from the squarer and filter circuit 3302 passes through comparators 3303 and 3304 (comprising National LM339 devices) whose reference inputs are set by resistors R1, R2 and R3 so that comparator 1 3303 asserts the H line when the incoming signal from the squarer and filter 3302 exceeds the reference signal at comparator 1 3303 and comparator 2 3304 asserts the L line whenever the input from the squarer and filter 3302 falls below the reference signal for comparator 2 3304.

Normally there will be as many filter and comparator sections (FIG. 33) in the filter and comparator function 3207 (FIG. 32) as there are sections in the equalizer. Thus the circuit, shown in FIG. 32 when enabled, will automatically servo adjust the equalizer so that each of the sections of the equalizer will stabilize at a point which produces and output from squarer and filter (e.g. 3302) falling within the reference voltage range of the comparators 3303 and 3304 in each section of the filter and comparator function 3207 so that the loop stabilizes with all comparator outputs unasserted. Thus once the loop is stabilized the equalizer 3202 will be correctly adjusted. The DC motors, (M1, M2, etc.), DC amplifiers (A1, etc.), microphone 3205, microphone amplifier 3206 and filter and comparator 3207 may now be removed from the audio system and the settings of the equalizer may be used to define the characteristics of the equalizer which is to be ultimately installed in the audio system from which the tested data was obtained.

The settings of the equalizer 3102 can be transported to the processing center by either returning the equalizer 3102 to the processing center or by arranging that each of the DC motors M1, M2, etc., has connected to its shaft a potentiometer, for example 3208, in FIG. 32 which is connected at one end to a positive supply and at the other end to ground. The voltage at the wiper of the potentiometer is proportional to the final setting of the equalizer by motor M1, and this voltage appears on line 3209. By using an additional sequential switch assembly, a voltage to frequency converter and a tape recorder in record mode, it is possible to store a series of signal bursts each corresponding to a voltage relating to the settings of each of the equalizer adjustments by selecting the voltage from the wiper of each of the potentiometers (of which 3208 is typical) connected to each of the motors (M1, M2, etc.) The tone burst sequence recorded on the tape can then be returned to the processing unit and this stored data may be used to implement an equalizer having the same characteristics as those to which equalizer 3202 was adjusted during the testing and stabilizing of the servo loop shown in FIG. 32.

Alternatively the circuit shown in FIG. 32 (without potentiometer 3208) may be left with the audio system to provide a means of re-equalizing the audio system at periodic intervals.

L. Use of D/A's and Memories to Replace Potentiometers

The potentiometers and motor drive combinations used in the system of FIGS. 23, 26 and 32 can be replaced with up/down counters 3101 and Multiplying D/A converters 3102 shown in FIG. 31a. The motor amplifier (e.g. 2616) in FIGS. 23 and 26 would be replaced with two comparators 3103 and 3104 (e.g. National LM339), whose reference inputs were set so that whenever the output from the difference block (e.g. 2614, FIG. 26) exceeds a predetermined amount, an increase count or a decrease count signal on lines 3105 and 3106 would be generated by the comparators 3103 and 3104 respectively. These signals would drive the selected (via switch e.g. 2617 in FIG. 26) up/down counter 3103 (e.g. T.I. SN74L193) which, in turn, would drive multiplying D/A converters 3102 to implement the function previously performed by the adjustment potentiometers. Once the equalizer was adjusted satisfactorily, the up/down counters 3101 could be replaced with non-volatile registers (using, for example, nMOS, or EAROM technologies), so that the value was not lost during power down or could be replaced with PROM memories programmed to have the same values as the final count in the up/down counter 3101. Alternatively in a system such as the one shown in FIG. 32 in which the automatic input equalizing system becomes a permanent part of the audio system, the up/down counters could remain and equalization could be performed automatically each time the audio system was turned on.

Figure 34:
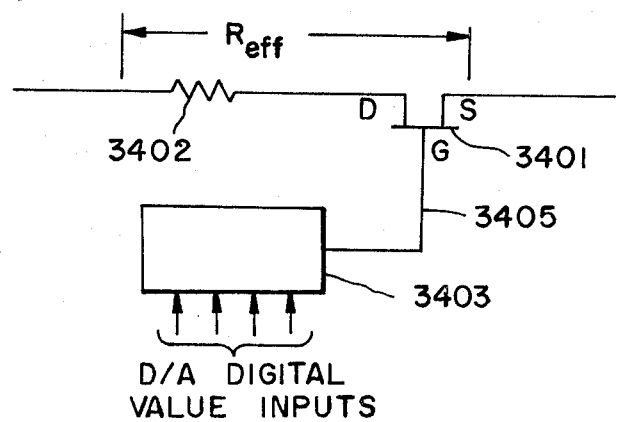
FIG. 34 shows an implementation of a digitally controlled variable resistor.

The multiplying D/A converters 3102 may be implemented using binary (or other ratio) weighted switch resistor networks (e.g. DATEL DAC-HA10BC). Alternatively (FIG. 34) pulse width or pulse rate multiplication techniques using for example rate multiplier 3403 (e.g. T.I. integrated circuit SN7497), may be used to simply implement an A/D converter by using a fast FET switch 3401 (e.g. Signetics SD210) with a series resistor 3402 connected to the FET drain. By pulse width or pulse rate switching via control line 3405, the gate at rates in excess of the audio frequency range (e.g. in the range of 40 KHz to 5 MHz, for example) the effective resistance of the FET and series resistor can be used as a digitally controlled variable resistor for audio range frequencies. The effective resistance is given by the value of the series resistance divided by the fraction of time that the FET is turned on. The effective resistance is measured between the source of the FET and the end of the series resistor not connected to the FET.

Such digitally controlled resistors can be used for example as resistors 1507 to 1510 in FIG. 15 to provide a means for digital adjustment of the equalizer, or in conjunction with an op-amp and fixed resistors to implement a multiplying D/A converter. FIG. 31b shows a configuration to replace each adjustable resistor R1, R2, etc. in FIG. 17a with a multiplying D/A converter 3120.

M. Distortion Equalization

What was been described to this point has been directed towards correction of linear defects in an audio system. Using the combinations of the techniques already described it is possible to correct for distortion by using, for example, sine waves at various frequencies and amplitudes accurately recording the shape of sine waves and determining the type of non-linear elements which are necessary to restore the sine waves to their original shape. The insertion of the non-linear elements can (provided the distortion is sufficiently small), be used to correct for the distortion before it occurs in the signal path, or subsequent to its occurence in the signal path.

N. Multiple Equalization

Because of differences in the response of each source of program material, an audio system may employ more than one equalizer or an equalizer with selectable characteristics in order to separately compensate for the response variations of program material (e.g. record player, FM tuner, etc.). For example, a separate equalizer may be placed between the record player 101 and preamplifier 106 (FIG. 1) to compensate for the response characteristics when playing a record. Another separate equalizer may also be used for the tuner 102 and placed between tuner 102 and preamp. 106 and so on for each program material source. Alternatively a single equalizer 107 may contain separate compensation for each of the components providing program material. This may be done by testing the response of each program material source, in conjunction with the audio system and implementing each the desired frequency characteristic in the equalizer 107. The desired characteristic is then selected by a program source switch on the front of equalizer 107. Such an equalizer could also be combined into pre-amplifier 106.

The data necessary to define the characteristics of each of the program material source equalizers can be obtained by performing tests on the system with test signals from an appropriate test unit and passed to the various program material sources. For example, in the case of the phonograph, to check the cartridge, tone arm and preamplifier RIAA response, a test record can be used as the test signal source. To check the characteristics of a tuner, an RF signal generated using, for example, RF modulation techniques described in with reference to FIGS. 7 and 9 may be used. To test a tape recorder, a generated test signal may be recorded and played back, or a prerecorder test tape may be used, depending on whether the source material to be played on the tape recorder comprises tapes recorded on the tape recorder or pre-recorded tapes. Finally auxilliary input characteristics may be evaluated by using the auxilliary input test signal (FIGS. 7 and 9). An equalizer may also have switch selectable compensation characteristics to select the best equalization for different room conditions (e.g. curtains open, curtains closed, a few peope or a large number in the room). The data necessary to define the equalizer characteristics under each condition can be obtained by performing tests under each condition.

O. Room Effects

Analysis of the variations frequency response due to the loudspeaker being placed in different room environments indicates that the frequency response of a loudspeaker in a room as perceived by a listener, is due to a combination of sound heard directly from the loudspeaker and sound reverberating within the room. If the room is lively and lacks absorbent material, a large portion of the sound heard will be due to reverberation. A number of types of test waveforms, including the impulse testing waveform, pulsed sine waves and low frequency square waves can be used to identify the ratio of sound which is direct, to sound which is due to reverbration. By adding further capabilities to the test unit or by providing a separate room evaluation unit, it is possible to measure the ratio of direct sound to reverberant sound for a range of listening signals. Based on this ratio and other measurements an indication can be provided to the customer to enable him to determine whether his room is too live or dead. Suggestions may also be made for optimum placement of the speakers based on such test measurements.

The measurement of the degree of reverberation can for example be performed using the impulse response.

Provided the data collection microphone is placed near the loudspeaker the initial few milliseconds of the impulse response can be attributed to direct sound while the subsequent portion of the response is due to reverberant sound. By determining the ratio of energy in the initial few milliseconds to the energy in the subsequent response, an indication of the ratio of direct to reverberant sound can be determined. Such an indication can be obtained by summing the sampled amplitudes of the first few milliseconds and comparing the sum to the amplitude during the time subsequent to the first few milliseconds. This ratio provides the customer with some insight into ways to improve the room response by changing speaker placement or adjusting the sound absorbing material in the room prior to performing the equalization tests.

P. Response Versus Amplitude

In some cases frequency response is strongly dependent upon amplitude. For example, in a cassette tape recording unit, the high end frequency response at a recorded level of 0 VU can be quite different to the frequency response at say $-10$ to $-20$ VU. An equalizer can be provided to minimize these affects. The characteristics for this equalizer can be determined by performing signal tests at different amplitudes and building the corresponding amplitude dependence into the resulting equalizer.

Q. Equalizer in Amplifier

There are of course a number of ways in which an equalizer can be accommodated. For example, although the equalizer is generally considered to be a separate unit in the customer's system, it may be convenient, when designing amplifiers, to make provision to accommodate an equalizer card or module within the amplifier and provide the equalizer as an option for the customer to insert in his amplifier.

R. Desired Equalization

Another option which may be provided to the customer is that of choosing the shape of the characteristic to which his system is equalized. This is particularly true of frequency response. Studies show that the ideal equalization curve for an amplifier system is not necessarily the one which provides a flat response. In some cases a so called "house curve" which is flat to 1,000 khz and then rolls off to 10 db down to 10 khz is found to produce a more realistic response. Thus it is possible in the equalizer to provide the user with the option of selecting a flat response for his system, a house curve or other response. Alternatively, with the adoption of automatic equalization it should be possible to establish standard room equalization characteristics so that source material such as records and prerecorded tapes may be generated with the knowledge that they will be played back not only through a preamplifier under which implements the RIAA standard response (or NAEB for tapes) but also provides the subjective standardized corrections such as the "house curve" already discussed.

The invention having been described, what is claimed is:

1. A method for producing a desired overall response characteristic, including effects of speaker and room environment of an audio system installed in a residence, said system including means for reproducing an audio signal from a record, a tape, a radio transmission receiver or the like and also including an amplifier and a speaker located in a room in the residence comprising the steps of
   (a) generating a test signal as an input to the audio system while in said room;
   (b) converting in said room the resulting sound generated by the speaker and its room environment into stored data whose values are a function of said sound;
   (c) manually transporting said stored data from said residence to a processing center;

(d) at said processing center, reading said stored data and utilizing the read out data to establish the response characteristics of an equalizer such that the latter, when installed in said audio system, the audio system will produce an overall response characteristic, including the effects of speaker and room environment, corresponding to the desired overall characteristic response; and (e) manually transporting the resulting equalizer to said residence and installing it in said audio system.

2. The method of claim 1 wherein step a includes the generation of an impulse test signal and step b includes sampling the resulting response signal at discrete intervals to generate data corresponding to the shape of said response signal and storing data corresponding to said generated data.

3. The method of claim 1 wherein step a includes the generating of a narrow band noise test signal and step b includes detecting the amplitude level of the resulting response signal to generate data corresponding to the frequency characteristics of said audio system and storing data.

4. The method of claim 1 wherein step d includes generating a test signal, applying the test signal to an equalizer, converting the resulting output of the equalizer into test data, comparing the test data to the stored data and adjusting the characteristics of the equalizer so that said test data corresponds to the stored data.

* * * * *